(12) United States Patent
Tanaka et al.

(10) Patent No.: US 8,470,115 B2
(45) Date of Patent: *Jun. 25, 2013

(54) ADHESIVE SHEET AND METHOD FOR MANUFACTURING THE SAME, SEMICONDUCTOR DEVICE MANUFACTURING METHOD AND SEMICONDUCTOR DEVICE

(75) Inventors: Maiko Tanaka, Ichihara (JP); Michio Uruno, Ichihara (JP); Takayuki Matsuzaki, Ichihara (JP); Ryoji Furutani, Ichihara (JP); Michio Mashino, Ichihara (JP); Teiichi Inada, Tsukuba (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/310,515

(22) Filed: Dec. 2, 2011

(65) Prior Publication Data

US 2012/0068312 A1 Mar. 22, 2012

Related U.S. Application Data

(62) Division of application No. 11/577,255, filed as application No. PCT/JP2005/018120 on Sep. 30, 2005.

(30) Foreign Application Priority Data

Oct. 14, 2004 (JP) ................ P2004-300541

(51) Int. Cl.
*B29C 65/50* (2006.01)
*B32B 37/14* (2006.01)
*B32B 38/10* (2006.01)
*B32B 38/04* (2006.01)

(52) U.S. Cl.
USPC ......... 156/247; 156/268; 156/289; 156/307.1

(58) Field of Classification Search
USPC .............. 156/247, 250, 257, 267, 268, 272.4, 156/273.7, 289, 307.1; 29/25.01; 428/355 EP, 428/355 AC, 355 R, 413
See application file for complete search history.

(56) References Cited

U.S. PATENT DOCUMENTS 4,999,242 A * 3/1991 Ishiwata et al. ............... 428/345
5,330,812 A 7/1994 Knoerzer et al.
(Continued)

FOREIGN PATENT DOCUMENTS

CN 1471566 1/2004
CN 1497703 5/2004
(Continued)

OTHER PUBLICATIONS

English Abstract of JP 2004-266137 (2012).*
(Continued)

*Primary Examiner* — Sing P Chan
(74) *Attorney, Agent, or Firm* — Antonelli, Terry, Stout & Kraus, LLP.

(57) ABSTRACT

An adhesive sheet comprising a release substrate 10, a substrate film 14, and a first tacky-adhesive layer 12 placed between the release substrate 10 and the substrate film 14, wherein an annular incision D is formed on the release substrate 10 from the surface of the first tacky-adhesive layer 12 side, the first tacky-adhesive layer 12 is laminated so as to cover the whole inner surface of the incision D in the release substrate 10, and the incision D has a depth d of less than the thickness of the release substrate 10 and 25 μm or less.

3 Claims, 25 Drawing Sheets

U.S. PATENT DOCUMENTS

| | | | |
|---|---|---|---|
| 6,506,490 | B1 | 1/2003 | Yamamoto |
| 2004/0007327 | A1* | 1/2004 | Kobayashi .................. 156/353 |
| 2004/0009650 | A1* | 1/2004 | Jeong et al. .................. 438/462 |
| 2005/0037542 | A1 | 2/2005 | Sato et al. |

FOREIGN PATENT DOCUMENTS

| | | |
|---|---|---|
| EP | 1411547 | 4/2004 |
| JP | H2-71878 | 5/1990 |
| JP | 6-501213 | 2/1994 |
| JP | 6-18383 | 3/1994 |
| JP | 6-502881 | 3/1994 |
| JP | 06-18383 | 5/1994 |
| JP | 7-15087 | 2/1995 |
| JP | 3021645 | 2/1996 |
| JP | 08-243997 | 9/1996 |
| JP | 09-085696 | 3/1997 |
| JP | 2678655 | 8/1997 |
| JP | 10-144375 | 5/1998 |
| JP | 2759590 | 5/1998 |
| JP | 10-291376 | 11/1998 |
| JP | 10-335271 | 12/1998 |
| JP | 11-034281 | 2/1999 |
| JP | 11-188830 | 7/1999 |
| JP | 11-309792 | 11/1999 |
| JP | 2000-221888 | 8/2000 |
| JP | 2000-254891 | 9/2000 |
| JP | 2001-051604 | 2/2001 |
| JP | 2001-059074 | 3/2001 |
| JP | 2001-162594 | 6/2001 |
| JP | 3348923 | 9/2002 |
| JP | 2003-136487 | 5/2003 |
| JP | 2004-042310 | 2/2004 |
| JP | 2004-043763 | 2/2004 |
| JP | 2004-045812 | 2/2004 |
| JP | 2004-046763 | 2/2004 |
| JP | 2004-072040 | 3/2004 |
| JP | 2004-134689 | 4/2004 |
| JP | 2004-512418 | 4/2004 |
| JP | 2004-217793 | 8/2004 |
| JP | 2004-256595 | 9/2004 |
| JP | 2004266137 A * | 9/2004 |
| JP | 2005-162818 | 6/2005 |
| JP | 2005-239759 | 9/2005 |
| JP | 2005-350520 | 12/2005 |
| KR | 10-0239847 | 1/2000 |
| WO | WO 92/08429 A1 | 5/1992 |
| WO | WO 03/016419 | 2/2003 |

OTHER PUBLICATIONS

Machine English Translation of JP 2004-266137 (Apr. 5, 2012).*
Japanese Official Action (Notice of Allowance) dated Jan. 4, 2011, for JP Application No. 2004-300541.
Presentation of Information to JPO received May 17, 2010, for Application No. 2004-300541.
Presentation of Information to JPO received May 18, 2010, for Application No. 2004-300541.
Presentation of Information to JPO received May 26, 2010, for Application No. 2004-300541.
Chinese Official Action issued on Nov. 20, 2009, for Application No. 2005800349933.
Translation of the International Preliminary Report on Patentability for Application No. PCT/JP2005/018120, dated Apr. 26, 2007.
U.S. Office Action dated Apr. 10, 2012, for U.S. Appl. No. 13/310,531.
U.S. Office Action dated Aug. 20, 2012, for US Appl. No. 11/577,255.
Chinese Official Action dated Dec. 6, 2012, for CN Application No. 201110060453.X.

* cited by examiner (a)

(b)

(c)

(a)

(b)

(c)

(d)

(e)

(a)

(b)

(c)

(a)

(b)

(c)

(d)

(a)

(b)

(c)

(a)

(b)

(c)

(a)

(b)

(c)

ADHESIVE SHEET AND METHOD FOR MANUFACTURING THE SAME, SEMICONDUCTOR DEVICE MANUFACTURING METHOD AND SEMICONDUCTOR DEVICE

This application is a Divisional application of prior application Ser. No. 11/577,255, filed Feb. 14, 2008, which is a National Stage Application filed under 35 USC 371, of International (PCT) Application No. PCT/JP2005/018120, filed Sep. 30, 2005. The contents of No. 11/577,255 are incorporated herein by reference in their entirety.

TECHNICAL FIELD

The present invention relates to an adhesive sheet and a production method thereof, and a production method of semiconductor device and a semiconductor device.

BACKGROUND ART

Recently, addition of multiple functionalities to and downsizing of mobile-related devices have been rapidly required. With this expansion, needs for high-density packaging technologies of semiconductor elements have been increased each year, in particular, the development of stacked multichip packaging (hereinafter referred to as "stacked MCP") in which semiconductor elements are laminated takes a central role.

In the development of the stacked MCP technology, two contrary goals, that is, down sizing of the package and multi-layer lamination are combined. In order to achieve the goals, technologies for making the thickness of silicon wafer used in semiconductor elements thinner have particularly been advanced, and wafers having a thickness of 100 μm or less have widely been used and studied. Also, since the multi-layer lamination complicates a package making step, it is demanded to simplify the package making step and to suggest making processes and materials that support the increase of the number of heat histories of wire-bonding by the multi-layer lamination.

Under the circumstance, as an adhesive material of the stacked MCP, paste materials have been used. The paste materials, however, have some problems such that run-out of a resin is caused in a bonding process of semiconductor elements, or the degree of precision of the film thickness is low. These problems cause failures in a wire-bonding step or voids in a paste agent, and consequently, when a paste material is used, the above-mentioned requirement cannot be addressed.

In order to improve the above-mentioned problems, these days, it tends to use an adhesive in the state of a film instead of a paste material. The adhesives in the state of a film can adjust an amount of a resin run-out smaller than paste materials, and can make the variation of film thickness smaller by improving a degree of precision of a film thickness, and, therefore, the application thereof to the stacked MCP is particularly widely studied.

The adhesive in the state of a film has usually a structure in which an adhesive layer is formed on a release substrate. One of the typical methods for using the adhesive in the state of a film is a method for sticking to a back surface of a wafer. The method for sticking to a back surface of a wafer is a method in which an adhesive in the state of a film is directly stuck to a back surface of a silicone wafer used in the production of semiconductor element. According to this method, after the adhesive in the state of a film is stuck to the semiconductor wafer, a release substrate is removed, and then a dicing tape is stuck to the adhesive layer. After that, it is mounted on a wafer ring, and the wafer is cut in a desired semiconductor element size together with the adhesive layer. The diced semiconductor elements have the adhesive layer having the same size as the element. The semiconductor elements with the adhesive layer are picked-up and stuck to a substrate for mounting the elements in a thermo compression bonding method, or the like.

Dicing tapes used in the method for sticking to a back surface have usually a structure in which a tacky layer is formed on a substrate film, and roughly divided into two kinds of the pressure-sensitive dicing tape and the UV type dicing tape. The dicing tapes are required to have, as one function, sufficient tack strength so that semiconductor elements are not scattered by a load generated when the wafer is cut in a dicing step. In addition, it is demanded that when the diced semiconductor elements are picked-up, the tacking agent is not left on each element, and therefore, the semiconductor element with the adhesive layer can be easily picked-up in a die bonder apparatus.

In order to shorten a step for making a package, the requirement of further process improvement has been increased. According to conventional methods for sticking to a back surface of a wafer, two steps are necessary, that is, a step in which adhesive in the state of a film is stuck to a wafer and a subsequent step in which a dicing tape is stuck. In order to simplify this process, adhesive sheet (die bond dicing sheet) having two function of an adhesive in the state of a film and a dicing tape. As this type of the adhesive sheet, a laminate type having a structure in which an adhesive in the state of a film and a dicing tape are laminated (see, for example, Patent Documents 1 to 3), and a mono-layered type in which one resin layer has both functions of a tacky layer and a adhesive layer (see, for example, Patent Document 4) are proposed.

Also, a method in which such an adhesive sheet is previously processed into a shape of a wafer constituting a semiconductor element (generally called as precut processing) is known (for example, Patent Documents 5 and 6). This precut processing is a method in which the resin layer is punched into a shape matching that of a wafer used, and a part of the resin layer other than the part to which the wafer is stuck is peeled off.

When such a precut processing is performed, the laminate type adhesive sheet is generally produced by a method in which an adhesive layer in an adhesive in the state of a film is subjected to precut processing matching with a shape of a wafer, and after it is laminated on a dicing tape, the dicing tape is subjected to precut processing for matching with a shape of a wafer ring, or a dicing tape which has previously been subjected to precut processing into a shape of a wafer ring is laminated an adhesive in the state of a film which is subjected to precut processing.

Also, a mono-layered type adhesive sheet is generally produced by a method in which a resin layer having two functions of an adhesive layer and a tacky layer (hereinafter referred to as "tacky-adhesive layer") is formed on a release substrate, the tacky-adhesive layer is subjected to precut processing, unnecessary parts of the resin layer are removed, and then it is laminated on a substrate film.

[Patent Document 1] Japanese Patent No. 3348923
[Patent Document 2] Japanese Patent Application Laid-Open Publication No. 10-335271
[Patent Document 3] Japanese Patent No. 2678655
[Patent Document 4] Japanese Patent Application Laid-Open Publication No. 7-15087
[Patent Document 5] Japanese Utility Model Application Laid-Open Publication No. 6-18383
[Patent Document 6] Japanese Utility Model No. 3021645

DISCLOSURE OF THE INVENTION

Problems to be Solved by the Invention

The precut processing of an adhesive film is performed in a method, for example, shown in FIG. 14. FIG. 14 is a process chart showing series of steps for performing a precut processing to a mono-layered adhesive sheet. As shown in FIG. 14, first, a release substrate 10 and a pressure-sensitive adhesive film (dicing tape) 20 comprising a tacky-adhesive layer 12 and a substrate film 14 are laminated to produce an adhesive sheet before precut (FIG. 14 (a)). Next, a cutting operation is performed by inserting a precutting blade C corresponding to a desired shape from a surface F14 of the substrate film 14 until the blade reach a release substrate 10 (FIG. 14 (b)). After that, unnecessary part on the tacky-adhesive layer 12 and the substrate film 14 are removed to complete the precut processing (FIG. 14 (c)). In case of the laminate type adhesive sheet, the same precut processing as in the above-mentioned procedure is performed except that the tacky-adhesive layer 12 is changed to an adhesive layer and a tacky layer.

Upon the precut processing, if the precutting blade C does not reach the release substrate 10, the cutting processing is insufficient, and, consequently, a failure in which necessary parts are also peeled off is caused in a peeling operation of unnecessary parts. In order to avoid such a cut failure, the inserting position of the precutting blade C has conventionally been set at a place deeper than an interface between the tacky-adhesive layer 12 and the release substrate 10.

The present inventors found, however, that the tacky-adhesive layer 12 in the adhesive sheet obtained in the precut processing in which the inserting position of the precutting blade C is set deep, as shown in FIG. 15, is bitten by an incision E in the release substrate 10, and an interface between the release substrate 10 and the tacky-adhesive layer 12 is sealed. The present inventors further found that when the adhesive sheet is laminated on a wafer while this state is kept, it is difficult to peel off the tacky-adhesive layer 12 from the release substrate 10, and peel defect easily occurs.

The precut processing of the adhesive film is performed in a method, for example, shown in FIG. 24. FIG. 24 is a process chart showing series of steps for performing a precut processing to a laminated adhesive sheet. As shown in FIG. 24, first, an adhesive in the state of a film comprising a release substrate 212 and an adhesive layer 214, and dicing tape comprising a substrate film 224 and a tacky layer 222 are laminated to produce an adhesive sheet before precut (FIG. 24 (a)). Next, cut operation in which a precutting blade C corresponding to a desired shape is inserted form a surface F24 of the substrate film 224 until the blade reaches the release substrate 212 is performed (FIG. 24 (b)). After that, unnecessary parts on the adhesive layer 214, the tacky layer 222 and a realest film 224 are removed to complete the precut processing (FIG. 24 (c)). In case of the mono-layered adhesive sheet, the same precut processing as in the above-mentioned procedure is performed except that, instead of the adhesive layer 214 and the tacky layer 222, a tacky-adhesive layer having the two functions is used. Upon the above-mentioned precut processing, if the precutting blade C does not reach the release substrate 212, the cutting processing is insufficient, and, consequently, a failure in which necessary parts are also peeled off is caused in a peeling operation of unnecessary parts. In order to avoid such a cut failure, the inserting position of the precutting blade C has conventionally been set at a place deeper than an interface between the adhesive layer 214 and the release substrate 212.

The present inventors found, however, that the adhesive layer 214 and the tacky layer 222 in the adhesive sheet obtained in the precut processing in which the inserting position of the precutting blade C is set deep, as shown in FIG. 25, is bitten by an incision F in the release substrate 212, and an interface between the release substrate 212 and the adhesive layer 214 is sealed. The present inventors further found that when the adhesive sheet is laminated on a wafer while this state is kept, it is difficult to peel off the adhesive layer 214 from release substrate 212, and peel defect easily occurs.

In view of the problems in the above-mentioned conventional techniques, the present invention has been made, and the invention aims at providing adhesive sheets which has been subjected to a precut processing, capable of fully inhibiting the peel defect of laminates including a tacky-adhesive layer and a substrate film from a release substrate, and the peel defect of laminates including an adhesive layer, a tacky layer and a substrate film; production methods thereof; method for producing a semiconductor device using the above-mentioned adhesive sheet; and semiconductor devices.

Means for Solving the Problems

In order to achieve the above-mentioned purposes, the present invention provides an adhesive sheet comprising a release substrate, a substrate film, and a first tacky-adhesive layer placed between the release substrate and the substrate film, wherein an annular incision is formed in the release substrate from the first tacky-adhesive layer side, the first tacky-adhesive layer is laminated so as to cover the whole inner surface of the incision in the release substrate, and the incision has a depth of less than the thickness of the release substrate and 25 µm or less.

Here, the incision depth in the present invention refers to a value obtained by measuring a depth of an incision formed in the release substrate in a thickness direction of the release substrate is measured with a cross-section observation using an electron microscope at 10 points arbitrarily selected, and averaging the obtained 10 values are averaged.

The adhesive sheet is an adhesive sheet which has been subjected to the above-mentioned precut processing. Since, in such an adhesive sheet, the depth of the incision in the release substrate is within the above-mentioned range, the first tacky-adhesive layer can be sufficiently inhibited from biting to the incision. As a result, the interface between the release substrate and the first tacky-adhesive layer is not sealed, and it is easy to peel off the first tacky-adhesive layer and the substrate film form the release substrate, whereby peel defect can be sufficiently inhibited.

It is preferable that, in the above-mentioned adhesive sheet, a value of (d/a) satisfies a condition showing the following formula (1):

$$0 < (d/a) \leq 0.7 \tag{1}$$

wherein a (µm) is a thickness of the release substrate, and d (µm) is a depth of the incision.

This gives that the first tacky-adhesive layer can be sufficiently inhibited from biting to the incision, and the peel defect can be sufficiently inhibited.

Also, it is preferable that, in the above-mentioned adhesive sheet, the first tacky-adhesive layer has a plane shape which matches a plane shape of an adherend to which the first tacky-adhesive layer is stuck after the release substrate is peeled off.

Examples of the adherend may include, for example, a semiconductor wafer. When the first tacky-adhesive layer has a plane shape which matches a plane shape of the semiconductor wafer, it tends to easily perform a step for dicing the semiconductor wafer. The plane shape of the first tacky-adhesive layer does not necessarily match the plane shape of the semiconductor wafer completely, but it may be, for example, analog of the plane shape of the semiconductor wafer or the area thereof may be a little bigger than that of the semiconductor wafer.

Further, it is preferable that, in the above-mentioned adhesive sheet, the first tacky-adhesive layer has tackiness to the adhered to which the first tacky-adhesive layer is stuck and the substrate film at room temperature, after peeling off the release substrate.

This gives that the semiconductor wafer is fixed sufficiently when the semiconductor wafer is subjected to dicing, thus resulting in easy dicing. Also, when a wafer ring is used and the adhesive sheet is stuck to the wafer ring so that the first tacky-adhesive layer is closely contacted to the ring in the dicing of the semiconductor wafer, sufficient tack strength to the wafer ring can be obtained, thus resulting in easy dicing.

Also, it is preferable that the tack strength of the above-mentioned first tacky-adhesive layer to the substrate film is lowered by irradiation of a high energy beam.

This gives that the peeling can be easily performed by irradiating high energy beams such as radial ray when the first tacky-adhesive layer is peeled off from the substrate film.

Also, it is preferable that the above-mentioned adhesive sheet further comprises a second tacky-adhesive layer placed between at least a part of a peripheral part of the first tacky-adhesive layer and the release substrate.

When the adhesive layer comprises such a second tacky-adhesive layer, it is possible to stick this second tacky-adhesive layer to a wafer ring, which is used upon dicing of a semiconductor wafer, and not to directly stick the first tacky-adhesive layer to the wafer ring. When the first tacky-adhesive layer is stuck directly to the wafer ring, it is necessary to adjust the tack strength of the first tacky-adhesive layer to a tack strength low enough to peel off from the wafer ring. When the second tacky-adhesive layer is stuck to the wafer ring, however, such an adjustment of the tack strength is not required. Consequently, when the first tacky-adhesive layer has a sufficiently high tack strength and the second tacky-adhesive layer has a tack strength low enough to easily peel off from the wafer ring, it is possible to more efficiently operate the dicing step of the semiconductor wafer and the subsequent steps such as peeling step of the wafer ring. Further, since the tack strength of the second tacky-adhesive layer can be controlled sufficiently low, it is easy to generate starting points of peeling between the release substrate and the second tacky-adhesive layer, whereby the second tacky-adhesive layer, the first tacky-adhesive layer and the substrate film can be easily peeled off from the release substrate, and thus the peel defect can be sufficiently inhibited.

Here, it is preferable that the above-mentioned second tacky-adhesive layer has tackiness to an adherend to which the second tacky-adhesive layer is stuck and the first tacky-adhesive layer at room temperature, after the release substrate is peeled off.

Also, it is preferable that the above-mentioned adhesive sheet further comprises an intermediate layer placed between at least a part of the peripheral part of the first tacky-adhesive layer and the second tacky-adhesive layer.

When the sheet comprises such an intermediate layer, it is possible to raise a degree of freedom of choice of materials for the second tacky-adhesive layer. For example, when a second tacky-adhesive layer having an adhesive sheet is produced, it is necessary to precut a second tacky-adhesive layer after the second tacky-adhesive layer is laminated on the release substrate. An inexpensive tacky-adhesive layer does not have self-supporting property, and therefore it can be difficult to completely peeled off it from the release substrate. However, when the intermediate layer is formed on the second tacky-adhesive layer, it is possible to easily remove the second tacky-adhesive layer together with the intermediate layer on precut, whereby the efficiency of the working can be promoted as well as the degree of freedom of the choice of the material for the second tacky-adhesive layer can be raised. This give that it is possible to easily adjust the tack strength of the second tacky-adhesive layer, it is easy to generate starting points of peeling between the release substrate and the second tacky-adhesive layer, and the second tacky-adhesive layer, the first tacky-adhesive layer, and the substrate film are easily peeled off from the release substrate, as a result, the peel defect can be sufficiently inhibited.

The present invention provides a method for producing an adhesive sheet including a release substrate, a substrate film and a first tacky-adhesive layer placed between the release substrate and the substrate film, comprising: a first laminating step in which the first tacky-adhesive layer and the substrate film are laminated on the release substrate; and a first cutting step in which an incision is made from an opposite side of the first tacky-adhesive layer on the substrate film until it reaches the release substrate, after the first laminating step, to form an annular incision in the release substrate, wherein the incision is made in the first cuffing step so as to have a depth of less than the thickness of the release substrate and 25 μm or less.

Also the present invention provides a method for producing an adhesive sheet including a release substrate, a substrate film, a first tacky-adhesive layer placed between the release substrate and the substrate film, and a second tacky-adhesive layer placed between the release substrate and the first tacky-adhesive layer, comprising: a second laminating step in which the second tacky-adhesive layer is partly laminated on the release substrate; a third laminating step in which the first tacky-adhesive layer and the substrate film are laminated on the release substrate and the second tacky-adhesive layer; and a second cutting step in which an incision is made from an opposite side of the first tacky-adhesive layer on the substrate film until it reaches the release substrate to form an annular incision in the release substrate, wherein the cutting in the second cutting step is performed so that the second tacky-adhesive layer is placed between at least a part of the peripheral part of the first tacky-adhesive layer and the release substrate within the area of the inside of the incision, and the incision has a depth of less than the thickness of the release substrate and 25 μm or less.

Further, the present invention provides a method for producing an adhesive sheet including a release substrate, a substrate film, a first tacky-adhesive layer placed between the release substrate and the substrate film, a second tacky-adhesive layer placed between the release substrate and the first tacky-adhesive layer, and an intermediate layer placed between the first tacky-adhesive layer and the second tacky-adhesive layer, comprising: a forth laminating step in which the second tacky-adhesive layer and the intermediate layer are partly laminated on the release substrate; a fifth laminating step in which the first tacky-adhesive layer and the substrate film are laminated on the release substrate and the intermediate layer; and a third cutting step in which an incision is made from an opposite side of the first tacky-adhesive layer on the substrate film until it reaches the release substrate to form an annular incision in the release substrate, wherein the cutting in the third cutting step is performed so that the second tacky-adhesive layer and the intermediate layer are placed between at least a part of the peripheral part of the first tacky-adhesive layer and the release substrate within the area of the inside of the incision, and the incision has a depth of less than the thickness of the release substrate and 25 μm or less.

In these methods for producing an adhesive sheet, precut processing is performed and a depth of an incision formed on the release substrate by the precut processing is adjusted to the above-mentioned range. This gives that peel defect can be sufficiently inhibited on the obtained adhesive sheet.

Also, it is preferable that the incision is made so that a value of (d/a) satisfies the following formula (1):

$$0 < (d/a) \leq 0.7 \tag{1}$$

wherein a (μm) is a thickness of the release substrate, and d (μm) is a depth of the incision in the first to the third cutting steps.

This gives that an adhesive sheet capable of more sufficiently inhibiting peel defect can be obtained.

The present invention provides a method for producing a semiconductor device comprising: a first peeling-off step in which the release substrate is peeled off from the adhesive sheet defined in any one of claims 1 to 5 to give a first laminate including the substrate film and the first tacky-adhesive layer; a sticking step in which the first tacky-adhesive layer in the first laminate is stuck to a semiconductor wafer; a first dicing step in which the semiconductor wafer and the first tacky-adhesive layer are subjected to dicing to give a semiconductor element to which the first tacky-adhesive layer is stuck; a first picking-up step in which the semiconductor element to which the first tacky-adhesive layer adheres is picked up from the substrate film; and a first bonding step in which the semiconductor element is bonded through the first tacky-adhesive layer to a support member for mounting a semiconductor element.

Also, the present invention provides a method for producing a semiconductor device comprising: a second peeling-off step in which the release substrate is peeled off from the adhesive sheet of the present invention to give a second laminate including the substrate film, the first tacky-adhesive layer and the second tacky-adhesive layer; a second sticking step in which the first tacky-adhesive layer in the second laminate is stuck to a semiconductor wafer, and the second tacky-adhesive layer is stuck to a wafer ring; a second dicing step in which the semiconductor wafer and the first tacky-adhesive layer are subjected to dicing to give a semiconductor element to which the first tacky-adhesive layer adheres; a second picking-up step in which the semiconductor element to which the first tacky-adhesive layer adheres is picked-up from the substrate film; and a second bonding step in which the semiconductor element is bonded through the first tacky-adhesive layer to a support member for mounting a semiconductor element.

Further, the present invention provides a method for producing a semiconductor device comprising: a third peeling-off step in which the release substrate is peeled off from the adhesive sheet of the present invention to give a third laminate including the substrate film, the first tacky-adhesive layer, the intermediate layer, and the second tacky-adhesive layer; a third sticking step in which the first tacky-adhesive layer in the third laminate is stuck to a semiconductor wafer, and the second tacky-adhesive layer is stuck to a wafer ring; a third dicing step in which the semiconductor wafer and the first tacky-adhesive layer are subjected to dicing to give a semiconductor element to which the first tacky-adhesive layer adheres; a third picking-up step in which the semiconductor element to which the first tacky-adhesive layer adheres is picked-up from the substrate film; and a third bonding step in which the semiconductor element is bonded through the first tacky-adhesive layer to a support member for mounting a semiconductor element.

According to these production methods, since the adhesive sheet of the present invention is used in the production step, peel defect caused during the production steps can be sufficiently inhibited and semiconductor devices can be efficiently and surely produced.

The present invention further provides a semiconductor device produced according to the method for producing a semiconductor device of the present invention.

The present invention provides an adhesive sheet comprising a release substrate, an adhesive layer, a tacky layer, and a substrate film, which are laminated in order, wherein the adhesive layer has a pre-determined first plane shape and is partly formed on the release substrate, a first incision is formed from a side bringing contact with the adhesive layer along the periphery of the plane shape on the release substrate; and the first incision has a depth of less than the thickness of the release substrate and 25 μm or less.

Here, the incision depth in the present invention refers to a value obtained by measuring a depth of an incision formed in the release substrate in a thickness direction of the release substrate is measured with a cross-section observation using an electron microscope at 10 points arbitrarily selected, and averaging the obtained 10 values are averaged.

The adhesive sheet is an adhesive sheet which has been subjected to the above-mentioned precut processing. Since, in such an adhesive sheet, the depth of the first incision in the release substrate is within the above-mentioned range, the adhesive layer and the tacky layer can be sufficiently inhibited from biting to the first incision. As a result, the interface between the release substrate and the adhesive layer is not sealed, and it is easy to peel off the adhesive layer, the tacky layer, and the substrate film form the release substrate, whereby peel defect can be sufficiently inhibited.

Also, it is preferable that, in the above-mentioned adhesive sheet, a value of (d1/a) satisfies the following formula (2):

$$0 < (d1/a) \leq 0.7 \tag{2}$$

wherein a (μm) is a thickness of the release substrate, and d1 (μm) is a depth of the first incision.

This gives that the adhesive layer and the tacky layer can be sufficiently inhibited from biting to the first incision, and the peel defect can be sufficiently inhibited.

It is preferable that, in the above-mentioned adhesive sheet, the tacky layer covers the adhesive layer and is laminated so as to bring contact with the release substrate around the adhesive layer. It is preferable that, in the above-mentioned adhesive sheet having the tacky layer, the tacky layer and the substrate film have pre-determined second plane shapes and are partly formed on the release substrate, a second incision is formed from a side bringing contact with the tacky layer along the periphery of the second plane shape on the release substrate; and the second incision has a depth of less than the thickness of the release substrate and 25 μm or less.

In such adhesive sheets, the adhesive layer is subjected to the precut processing, and the tacky layer, which is laminated so as to cover this adhesive layer, and the substrate film are separately subjected to the precut processing. Since the depth of the second incision in the release substrate of the adhesive sheet is within the above-mentioned range, the tacky layer can be sufficiently inhibited from the biting to the second incision. As a result, the interface between the release substrate and the tacky layer is not sealed, and the tacky layer and the substrate film are easily peeled off from the release substrate, thus resulting in sufficient inhibition of the peel defect.

It is preferable that, in the above-mentioned adhesive sheet, a value of (d2/a) satisfies the following formula (3):

$$0<(d2/a)\leq 0.7 \tag{3}$$

wherein a (µm) is a thickness of the release substrate, and d2 (µm) is a depth of the second incision.

This gives that the tacky layer can be sufficiently inhibited from the biting to the second incision, and the peel defect can be sufficiently inhibited.

Also it is preferable that, in the above-mentioned adhesive sheet, the adhesive layer has a plane shape which matches a plane shape of an adherend to which the first tacky layer is stuck after the release substrate is peeled off.

Examples of the adherend may include, for example, a semiconductor wafer. When the adhesive layer has a plane shape which matches a plane shape of the semiconductor wafer, it tends to easily perform a step for dicing the semiconductor wafer. The plane shape of the adhesive layer does not necessarily match the plane shape of the semiconductor wafer completely, but it may be, for example, analog of the plane shape of the semiconductor wafer or the area thereof may be a little bigger than that of the semiconductor wafer.

Further, it is preferable that, in the above-mentioned adhesive sheet, the tacky layer has tack strength to the adherend to which the tacky layer is stuck and the adhesive layer at room temperature after the release substrate is peeled off.

This gives that the semiconductor wafer is fixed sufficiently when the semiconductor wafer is subjected to dicing, thus resulting in easy dicing. Also, when a wafer ring is used and the adhesive sheet is stuck to the wafer ring so that the tacky layer is closely contacted to the ring in the dicing of the semiconductor wafer, sufficient tack strength to the wafer ring can be obtained, thus resulting in easy dicing.

Also, it is preferable that, in the above-mentioned tacky layer, the tacky layer has tack strength to the adhesive layer, which is lowered by irradiating high energy beams.

This gives that the peeling can be easily performed by irradiating high energy beams such as radial ray when adhesive layer and the tacky layer are peeled off from each other.

The present invention also provide a method for producing an adhesive sheet including a release substrate, an adhesive layer, a tacky layer and a substrate film, which are laminated in order, comprising a first laminating step in which the adhesive layer, the tacky layer, and the substrate film are laminated in order on the release substrate; and a first cutting step in which an incision is made from an opposite side bringing contact with the tacky layer on the substrate film until it reaches the release substrate to cut the adhesive layer, the tacky layer and the substrate film in pre-determined plane shapes and to form a first incision in the release substrate; wherein the incision is made so that the first incision has a depth of less than the thickness of the release substrate and 25 µm or less in the first cutting step.

In the method for producing an adhesive sheet, precut processing is performed and a depth of a first incision formed on the release substrate by the precut processing is adjusted to the above-mentioned range. This gives that peel defect can be sufficiently inhibited on the obtained adhesive sheet.

Also it is preferable that the incision is made so that a value of (d1/a) satisfies the following formula (2):

$$0<(d1/a)\leq 0.7 \tag{2}$$

wherein a (µm) is a thickness of the release substrate, and d1 (µm) is a depth of the first incision in the first cutting step.

This gives that an adhesive sheet capable of more sufficiently inhibiting peel defect can be obtained.

The present invention further provides a method for producing an adhesive sheet including a release substrate, an adhesive layer, a tacky layer, and substrate film, which are laminated in order, comprising: a second laminating step in which the adhesive layer is laminated on the release substrate; a second cutting step in which an incision is made from an opposite side bringing contact with the release substrate on the adhesive layer until it reaches the release substrate to cut the adhesive layer in a pre-determined plane shape and to form a first incision in the release substrate; and a third laminating step in which the tacky layer, and the substrate film are laminated in order on the adhesive layer, wherein the incision is made so that the first incision has a depth of less than the thickness of the release substrate and 25 µm or less in the second cutting step.

In this method for producing an adhesive sheet, precut processing is also performed and a depth of a first incision formed on the release substrate by the precut processing is also adjusted to the above-mentioned range, and accordingly, the peel defect can be sufficiently inhibited on the obtained adhesive sheet.

It is preferable that the incision is made so that a value of (d1/a) satisfies the following formula (2):

$$0<(d1/a)\leq 0.7 \tag{2}$$

wherein a (µm) is a thickness of the release substrate, and d1 (µm) is a depth of the first incision in the second cutting step.

This gives that an adhesive sheet capable of more sufficiently inhibiting the peel defect can be obtained.

Also, it is preferable that, in the above-mentioned method for producing the adhesive sheet, the tacky layer covers the adhesive layer, and the tacky layer and the substrate film are laminated so as to bring contact with the release substrate around the adhesive layer in the third laminating step; which further comprises a third cutting step in which an incision is made from an opposite side bringing contact with the tacky layer on the substrate film until it reaches the release substrate to cut the substrate film and the tacky layer in a pre-determined plane shapes and to form a second incision in the release substrate, the second incision in the third cutting step being made so as to have a depth less than the thickness of the release substrate and 25 µm or less.

In the production method of the adhesive sheet, the depth of the second incision formed on the release substrate by the precut processing is adjusted to the above-mentioned range, and accordingly the obtained adhesive sheet can sufficient inhibited the peel defect.

It is preferable that the incision is made so that a value of (d2/a) satisfies the following formula (3):

$$0<(d2/a)\leq 0.7 \tag{3}$$

wherein a (µm) is a thickness of the release substrate, and d2 (µm) is a depth of the second incision in the third cutting step.

This gives that an adhesive sheet capable of more sufficiently inhibiting the peel defect can be obtained.

The present invention also provides a method for producing a semiconductor device comprising: a sticking step in which a laminate including the adhesive layer, the tacky layer and the substrate film in the adhesive sheet of the present invention, is peeled out from the release substrate, and the laminate is stuck through the adhesive layer to a semiconductor wafer to give a semiconductor wafer having the laminate; a dicing step in which the semiconductor wafer having the laminate is subjected to dicing to give a semiconductor element having a laminate with a pre-determined size; a peeling-off step in which the tacky layer on the laminate is irradiated with high energy beams to lower the tack strength of the tacky layer to the adhesive layer, and then the tacky layer and the substrate film are peeled off form the adhesive layer to give a semiconductor element having the adhesive layer; and a bonding step in which the semiconductor element having the adhesive layer is bonded through the adhesive layer to a support member for mounting a semiconductor element.

According to the production method, since the adhesive sheet of the present invention is used in the production step, peel defect caused during the production steps can be sufficiently inhibited and semiconductor devices can be efficiently and surely produced.

Further, the present invention provides a semiconductor device which is produced according to the method for producing a semiconductor device of the present invention.

Effects of the Invention

According to the present invention, adhesive sheets to which the precut processing is subjected and which is capable of sufficiently inhibiting the peel defect of the laminate including the tacky-adhesive layer and the substrate film or the peel defect of the laminate including the adhesive layer, tacky layer and the substrate film, from the release substrate; production methods thereof, methods for producing a semiconductor device using the adhesive sheet, and semiconductor devices can be provided.

DESCRIPTION OF THE REFERENCE SYMBOLS 1, 2, 3, 201, 202 and 203: adhesive sheets, 10 and 212: release substrates, 12: a first tacky-adhesive layer, 14 and 224: substrate films, 16: a second tacky-adhesive layer, 18: an intermediate layer, 20: a first laminate, 22: a second laminate, 24: a third laminate, 32: semiconductor wafer, 33 and 72: semiconductor elements, 34: wafer ring, 36: stage, 42 and 242: first rolls, 44: a core, 52 and 252: second rolls, 54: a core, 62 and 68: rolls, 70: organic substrate, 71: a supporting member for mounting a semiconductor, 74: a circuit pattern, 76: a terminal, 78: a wire stick, 80: a sealer, 210: a laminate, 214: an adhesive layer, 220: a pressure-sensitive adhesive film, and 222: tacky layer.

BEST MODES FOR CARRYING OUT THE INVENTION

Now, the most preferable embodiments of the present invention will be described in detail with reference to the accompanying drawings. In the following description, the same numbers are given to the same or corresponding structure members, and when the explanations thereof overlap, the later explanations are omitted. The position relations such as top and bottom, or right and left are based on a position relation indicated in a drawing, unless otherwise noted. In addition, size proportions are not limited to those shown in drawings.

Adhesive Sheet

First Embodiment

Figure 1:
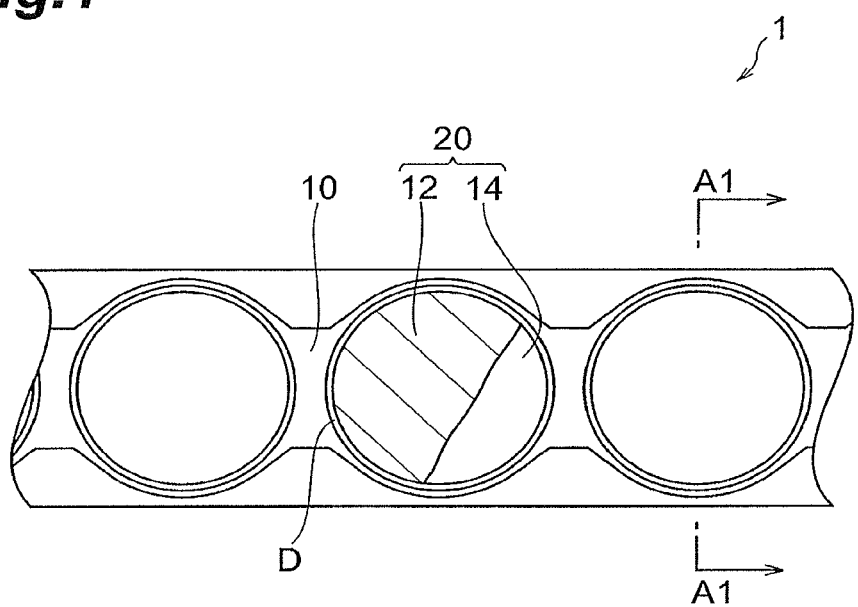
FIG. 1 is a plane view showing a first embodiment of an adhesive sheet of the present invention.
Figure 2:
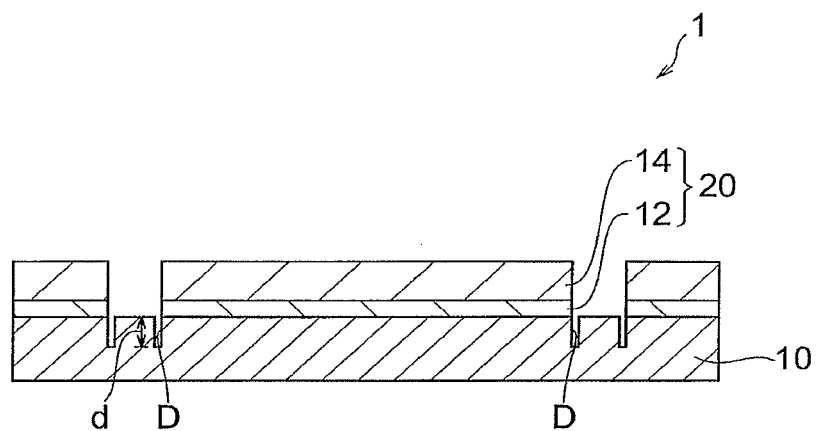
FIG. 2 is a schematic cross-section view of the adhesive sheet 1 shown in FIG. 1 which is cut along the line A1-A1 in FIG. 1.

FIG. 1 is a plane view showing a first embodiment of an adhesive sheet of the present invention; and FIG. 2 is a schematic cross-section view of the adhesive sheet 1 shown in FIG. 1 which is cut along the line A1-A1 in FIG. 1. As shown in FIG. 1 and FIG. 2, adhesive sheet 1 has a structure in which a release substrate 10, a first tacky-adhesive layer 12 and a substrate film 14 are laminated in order. A first laminate 20 composed of the first tacky-adhesive layer 12 and the substrate film 14 is cut in a pre-determined plane shape, and partly laminated on the release substrate 10. Further, in the release substrate 10, an annular incision D is formed along a periphery of the plane shape of the first laminate 20 from a surface facing the first tacky-adhesive layer 12 in a thickness direction of the release substrate 10. The first laminate 20 is laminated so as to cover the whole inside surface of the incision D formed in the release substrate 10.

Here, the above-mentioned pre-determined plane shape of the first laminate 20 is not particularly limited so long as it the first laminate 20 can be partly laminated on the release substrate 10. It is preferable that the above-mentioned pre-determined plane shape of the first laminate 20 matches a plane shape of an adherend such as a semiconductor wafer, and a shape that can be easily stuck to a semiconductor wafer having a shape of, for example, a circle, a rough circle, a quadrangle, a pentagon, a hexagon, an octagon or a wafer shape (a shape having a straight line in a part of the circumference of the circle) is preferable. Of these, the circle and the wafer shape are preferable, in order to reduce wasted part such as parts other that a part for mounting the semiconductor wafer.

Figure 3:
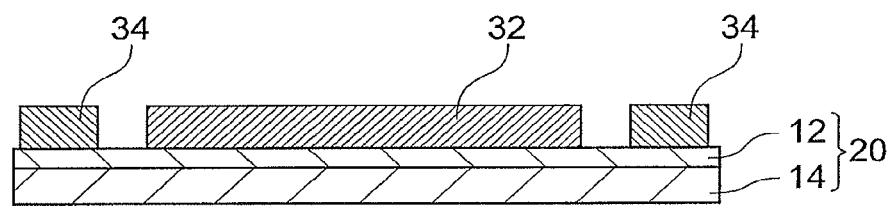
FIG. 3 is a schematic cross-section view showing a state in which a first laminate 20, a semiconductor wafer 32 and a wafer ring 34 are stuck in an adhesive sheet.

When the semiconductor wafer is subjected to dicing, a wafer ring is usually used for treating it on a dicing apparatus. In such a case, as shown in FIG. 3, the release substrate 10 is peeled off from an adhesive sheet 1, a wafer ring 34 is stuck to the first tacky-adhesive layer 12, and a semiconductor wafer 32 is stuck to the inside thereof. Here, the wafer ring 34 has a circular cylinder frame or a square pole frame. It is further preferable that a first laminate 20 of the adhesive sheet 1 has a plane shape matching the shape of the wafer ring 34.

Also, it is preferable that the first tacky-adhesive layer 12 can sufficiently hold the adherends such as the semiconductor wafer and the wafer ring at room temperature (25° C.), and the thickness thereof is thick enough to be able to peel off the wafer ring, and the like after dicing.

In the adhesive sheet 1, the incision D formed in the release substrate 10 has an incision depth d less than the thickness of the release substrate 10 and 25 μm or less.

Now, each layer constituting the adhesive sheet 1 will be described in detail.

The release substrate 10 serves as a carry film when the adhesive sheet 1 is used. As the release substrate 10, for example, polyester films such as polyethylene terephthalate film; polyolefin firms such as polytetrafluoroethylene film, polyethylene film, polypropylene film, polymethylpentene film, and polyvinyl acetate film; plastic films such as polyvinyl chloride film and polyimide film, and the like can be used. In addition, paper sheets, non-woven fabrics, metal foils, and the like can also be used.

Also, it is preferable that the surface of the release substrate 10 facing the first tacky-adhesive layer 12 is surface-treated with a release agent such as a silicone releasing agent, fluorine releasing agent, long chain alkyl acrylate releasing agent.

The thickness of the release substrate 10 can suitably selected within a range where workability is not impaired upon use. The release substrate 10 has a thickness of, preferably, 10 to 500 μm, more preferably 25 to 100 μm, particularly preferably 30 to 50 μm.

The first tacky-adhesive layer 12 may include, for example, a thermoplastic component, a heat-polymerizable component, a radial ray-polymerizable component, and the like. When such a component is included in the composition, the first tacky-adhesive layer 12 can have a curable property with radial rays (such as ultraviolet radiation) or heat. Also, a component which is cured with high energy beams other than the radial rays (such as an electron beam, and the like) may be included.

Here, when the radial ray-polymerizable component is included in the first tacky-adhesive layer 12, pick-up can be easily performed by improving tack strength upon dicing with optical illumination after the first tacky-adhesive layer 12 is stuck to the adherend to the semiconductor wafer and before performing the dicing, or conversely by lowering the tack strength with optical illumination after the dicing is performed. In the present invention, as such a radial ray-polymerizable component, any compound which is used in conventional radial ray-polymerizable dicing sheets can be used without particular limitations. Also, when a thermosetting compound is included, the reliability of the semiconductor device can be improved by curing the first tacky-adhesive layer 12 with heat generated when the semiconductor element is mounted on a support member on which the element is mounted, or it passes through a solder reflow. Now, each component will be described in detail.

As the thermoplastic component used in the first tacky-adhesive layer 12, resins having thermal plasticity, and resins having thermal plasticity at least in its uncured state and forming a cross-linked structure after heating can be used without particular limitations. As such a thermoplastic component, for example, (1) components having a Tg (glass transition temperature) of 10 to 100° C. and a weight average molecular weight of 5000 to 200000, and (2) components having a Tg of −50 to 10° C. and a weight average molecular weight of 100000 to 1000000 are preferably used.

Examples of the above-mentioned thermoplastic resin (1) may include, for example, polyimide resins, polyamide resins, polyether imide resins, polyamide imide resins, polyester resins, polyester imide resins, phenoxy resins, polysulfone resins, polyether sulfone resins, polyphenylene sulfide resins, polyether ketone resins, and the like. Of these, it is preferable to use the polyimide resins. As the above-mentioned thermoplastic resin (2), it is preferable to use polymers having a functional monomer.

Preferable one of these thermoplastic resins is the polyimide resin. Such a polyimide resin may be obtained by, for example, condensation reaction of tetracarboxylic dianhydride and diamine in a known manner. That is, addition reaction of tetracarboxylic dianhydride and diamine is performed in equal mole or almost equal mole (the addition order of each component is arbitrary) in an organic solvent at a reaction temperature of 80° C. or less, preferably 0 to 60° C. The viscosity of the reaction liquid gradually increases with the advance of the reaction, and then a polyamide acid, which is a precursor of polyimide, is generated.

Preferable one of these thermoplastic resins is the polymer including a functional monomer. Examples of the functional group in such a polymer may include, for example, glycidyl group, acryloyl group, methacryloyl group, hydroxyl group, carboxyl group, isocyanurate group, amino group, amido group, and the like. Of these, glycidyl group is preferable. More specifically, glycidyl group-containing (meth)acrylic copolymers, which include a functional monomer such as glycidyl acrylate or glycidyl methacrylate, are preferable, and the copolymers which are non-compatible with a thermosetting resin such as an epoxy resin are more preferable.

Examples of the high molecular weight component having a weight average molecular weight of 100000 or more among the above-mentioned polymer having a functional monomer may include glycidyl group-containing (meth)acrylic copolymers having a functional monomer such as glycidyl acrylate or glycidyl methacrylate, and a weight average molecular weight of 100000 or more, and the like. Of these, the copolymers non-compatible with epoxy resins are preferable.

As the above-mentioned glycidyl group-containing (meth) acrylic copolymer, for example, (meth)acrylic ester copolymers, acrylic rubbers, and the like may be used, and the acrylic rubbers are more preferable. The acrylic rubber includes an acrylic ester as a main component, and is mainly composed of a copolymer comprising butyl acrylate and acrylonitrile, or a copolymer comprising ethyl acrylate and acrylonitrile.

The above-mentioned functional monomer refers to a monomer having a functional group, as such a monomer it is preferable to use glycidyl acrylate, glycidyl methacrylate or the like. The glycidyl group-containing (meth)acrylic copolymer having a weight average molecular weight of 100000 or more is specifically, for example, HTR-860P-3™ manufactured by Nagase Chemtex Corporation, and the like.

An amount of the epoxy resin-containing monomer units such as glycidyl acrylate or glycidyl methacrylate as mentioned above is preferably 0.5 to 50% by weight based on the whole weight of the monomers, for effectively forming a network structure by curing with heat. The amount is preferably from 0.5 to 6.0% by weight, more preferably 0.5 to 5.0% by weight, particularly preferably 0.8 to 5.0% by weight, from the view point that adhesive strength can be secured as well as gelation can be prevented.

Examples of the above-mentioned functional monomer other than the glycidyl acrylate and the glycidyl methacrylate may include, for example, ethyl(meth)acrylate, butyl(meth) acrylate, and the like. They may be used alone or as a combination thereof. In the present invention, the ethyl(meth) acrylate refers to ethyl acrylate, or ethyl methacrylate. The mix ratio of the functional monomers in the combination thereof is decided in consideration of the Tg of the glycidyl group-containing (meth)acrylic copolymer, and it is preferable that the ratio is set so that the Tg is −10° C. or more. When the Tg is −10° C. or more, tuck property of a tacky-adhesive layer is appropriate in B stage, and handling tends to be good.

When the high molecular weight component having the functional monomer and a weight average molecular weight of 100000 or more is produced by polymeriaing the above-mentioned monomer,
the polymerization method is not particularly limited, and, for example, methods such as pearl polymerization or solution polymerization may be used.

Although the high molecular weight component having a functional monomer has a weight average molecular weight of 100000 or more, the molecular weight is preferably from 300000 to 3000000, more preferably from 500000 to 2000000. When the weight average molecular weight is within this range, the strength, flexibility and tuck property of the sheet or film thereof are appropriate, and the flow property is appropriate, and, consequently, it tends to provide good circuit self-compacting property of wiring. In the present invention, the weight average molecular weight is a value obtained by performing a measurement with gel permeation chromatography and converting the measured value using a standard polystyrene analytical curve.

The high molecular weight component having a functional monomer and a weight average molecular weight of 100000 or more is used in an amount of, preferably, 10 to 400 parts by weight based on 100 parts by weight of heat-polymerizable component. When the amount is within this range, the storage elasticity modulus and the inhibition of flow property upon molding can be secured, and the handling can tend to be good at a high temperature. Also, the high molecular weight component is used in an amount of, more preferably 15 to 350 parts by weight, particularly preferably 20 to 300 parts by weight based on 100 parts by weight of the heat-polymerizable component.

As heat-polymerizable component used in the first tacky-adhesive layer 12, any compounds may be used without particular limitations so long as they polymerize with heat, and examples thereof may include compounds having a functional group such as glycidyl group, acryloyl group, methacryloyl group, hydroxyl group, carboxyl group, isocyanurate group, amino group, or amido group. They may be used alone or in combination thereof. It is preferable to use thermosetting resins which are cured with heat to exert adhesive action, in consideration of the heat resistance as an adhesive sheet.

Examples of the thermosetting resin may include, for example, epoxy resins, acrylic resins, silicone resins, phenol resins, thermosetting polyimide resins, polyurethane resins, melamine resins, urea resins, and the like. In particular, the epoxy resins are preferable, because adhesive sheets having high heat resistance, workability, and reliability can be obtained therefrom.

The epoxy resins are not particularly limited so long as they cure to show adhesive action. As such an epoxy resin, for example, difunctional epoxy resins such as a bisphenol A type epoxy resin, and novolac type epoxy resins such as a phenol-novolac type epoxy resin or a cresol novolac type epoxy resin may be used. In addition, generally known resins such as a polyfunctional epoxy resin, a glycidyl amine type epoxy resin, a hetero ring-containing epoxy resin, and an alicyclic epoxy resin may be used.

Examples of the bisphenol A type epoxy resin may include Epikote series manufactured by Japan Epoxy Resins Co., Ltd. (Epikote 807, Epikote 815, Epikote 825, Epikote 827, Epikote 828, Epikote 834, Epikote 1001, Epikote 1004, Epikote 1007, and Epikote 1009); DER-330, DER-301 and DER-361 manufactured by Dow Chemical Company; YD 8125 and YDF 8170 manufactured by Tohto Kasei Co., Ltd., and the like.

Examples of the phenol-novolac type epoxy resin may include Epikote 152 and Epikote 154 manufactured by Japan Epoxy Resins Co., Ltd.; EPPN-201 manufactured by Nippon Kayaku Co., Ltd.; DEN-438 manufactured by Dow Chemical Company, and the like. Examples of the o-cresol novolac type epoxy resin may include EOCN-102 S, EOCN-103 S, EOCN-104 S, EOCN-1012, EOCN-1025, and EOCN-1027 manufactured by Nippon Kayaku Co., Ltd.; YDCN 701, YDCN 702, YDCN 703, and YDCN 704 manufactured by Tohto Kasei Co., Ltd., and the like.

Examples of the polyfunctional epoxy resin may include Epon 1031 S manufactured by Japan Epoxy Resins Co., Ltd.; Araldit 0163 manufactured by Chiba Speciality Chemicals Inc.; Denakole EX-611, EX-614, EX-614B, EX-622, EX-512, EX-521, EX-421, EX-411, EX-321 manufactured by Nagase Chemtex Corporation, and the like.

Examples of the amine type epoxy resin may include Epikote 604 manufactured by Japan Epoxy Resins Co., Ltd.; YH-434 manufactured by Tohto Kasei Co., Ltd.; TETRAD-X and TETRAD-C manufactured by Mitsubishi Gas Chemical Company, Inc.; ELM-120 manufactured by Sumitomo Chemical Co., Ltd., and the like.

Examples of the hetero ring-containing epoxy resin may include Araldit PT 810 manufactured by Chiba Speciality Chemicals Inc.; ERL 4234, ERL 4299, ERL 4221, and ERL 4206 manufactured by UCC INC., and the like. These epoxy resins may be used alone or in combination thereof.

When the epoxy resin is used, it is preferable to use a curing agent for epoxy resin. Known curing agents which are usually used may be used as the curing agent for epoxy resin. Examples thereof are, for example, amines, polyamide, acid anhydride, polysulfide, boron trifluoride, dicyandiamide, bisphenols having two or more phenolic hydroxyl group in one molecule such as bisphenol A, bisphenol F and bisphenol S, phenol resins such as phenol-novolac resin, bisphenol A-novolac resin and creosol-novolac resin, and the like. The phenol resins such as the phenol-novolac resin, the bisphenol A-novolac resin and the creosol-novolac resin are particularly preferable, because they have good electric corrosion resistance when they absorb moisture. In the present invention, the curing agent for epoxy resin includes curing accelerators which catalytically affect the epoxy group and accelerates formation of cross-linking.

Preferable examples of the above-mentioned phenol resin curing agent may include, for example, Phenolite™ LF 2882, Phenolite LF 2822, Phenolite TD-2090, Phenolite TD-2149, Phenolite VH-4150, and Phenolite VH4170 manufactured by Dainippon Ink and Chemicals, Incorporated; H-1™ manufactured by Meiwa Plastic Industries, Ltd.; E-Picure™ MP 402 FPY, E-picure YL 6065, and E-picure YLH 129 B65 manufactured by Japan Epoxy Resins Co., Ltd.; Milex™ XL, Milex XLC, Milex RN, Milex RS, and Milex VR manufactured by Mitsui Chemicals, Inc., and the like.

The radial ray-polymerizable components used in the first tacky-adhesive layer 12 are not particularly limited, and the following compounds may be used, for example, methyl acrylate, methyl methacrylate, ethyl acrylate, ethyl methacrylate, butyl acrylate, butyl methacrylate, 2-ethylhexyl acrylate, 2-ethylhexyl methacrylate, pentenyl acrylate, tetrahydrofurfuryl acrylate, tetrahydrofurfuryl methacrylate, diethylene glycol diacrylate, triethylene glycol diacrylate, tetraethylene glycol diacrylate, diethylene glycol dimethacrylate, triethylene glycol dimethacrylate, tetraethylene glycol dimethacrylate, trimethylol propane diacrylate, trimethylol propane triacrylate, trimethylol propane dimethacrylate, trimethylol propane trimethacrylate, 1,4-butanediol diacrylate, 1,6-hexanediol diacrylate, 1,4-butanediol dimethacrylate, 1,6-hexanediol dimethacrylate, pentaerythritol triacrylate, pentaerythritol tetraacrylate, pentaerythritol trimethacrylate, pentaerythritol tetramethacrylate, dipentaerythritol hexaacrylate, dipentaerythritol hexamethacrylate, styrene, divinyl benzene, 4-vinyl toluene, 4-vinyl pyridine, N-vinylpyrrolidone, 2-hydroxyethyl acrylate, 2-hydroxyethyl methacrylate, 1,3-acryloyloxy-2-hydroxypropane, 1,2-methacryloyloxy-2-hydroxypropane, methylene bisacrylamide, N,N-dimethylacrylamide, N-methylolacrylamide, triacrylate of tris(β-hydroxyethyl)isocyanurate, and the like.

Also, to the first adhesive layer 12 may be added a photoinitiator (such as a compound forming free radical with irradiation of actinic light.
Examples of the photoinitiator may include, for example, aromatic ketones such as benzophenone, N,N'-tetramethyl-4, 4'-diaminobenzophenone (Michler's ketone), N,N'-tetraethyl-4,4'-diaminobenzophenone, 4-methoxy-4'-dimethylaminobenzophenone, 2-benzyl-2-dimethylaminol-(4-morpholinophenyl)-butanone-1,2,2-dimethoxy-1,2-diphenylethanel-one, 1-hydroxycyclohexylphenyl-ketone, 2-methyl-1-(4-(methylthio)phenyl)-2-morpholinopropanone-1,2,4-diethyl thioxanthone, 2-ethyl anthraquinone, and phenanthrene quinone; benzoin ethers such as benzoin methyl ether, benzoin ethyl ether and benzoinphenyl ether; benzoins such as methylbenzoin and ethyl benzoin; benzyl derivatives such as benzil dimethyl ketal; 2,4,5-triarylimidazole dimers such as 2-(o-chlorophenyl)-4,5-diphenylimidazole dimer, 2-(o-chlorophenyl)-4,5-di(m-methoxyphenyl) imidazole dimer, 2-(o-fluorophenyl)-4,5-phenylimidazole dimer, 2-(o-methoxyphenyl)-4,5-diphenylimidazole dimer, 2-(p-methoxyphenyl)-4,5-diphenylimidazole dimer, 2,4-di (p-methoxyphenyl)-5-phenylimidazole dimer, and 2-(2,4-dimethoxyphenyl)-4,5-diphenylimidazole dimer; acridine derivatives such as 9-phenyl acridine and 1,7-bis(9,9'-acridinyl)heptane, and the like.

Also, to the first adhesive layer 12 may be added a photoinitiator generating a base and radical by irradiation of radial rays. This gives that a light-curable component is cured with radical generated by optical illumination before or after dicing, as well as a base, which is a curing agent for a thermosetting resin, is generated in the system, and, after that, the first tacky-adhesive layer 12 can be effectively subjected to thermosetting reaction with heat history, whereby it is not necessary to add separately initiators for light reaction and thermosetting reaction. As such a photoinitiator generating a base and a radical by irradiation of radial rays, for example, 2-methyl-1(4-(methylthio)phenyl-2-morpholinopropane-1-one (Erasure 907 manufactured by Ciba Speciality Chemicals), 2-benzyl-2-dimethylamino-1-(4-morpholinophenyl)-butanone-1-one (Erasure 369 manufactured by Ciba Speciality Chemicals), hexaarylbisimidazole derivatives (phenyl group may be substituted by a sutstituent such as halogen, alkoxy group, nitro group or cyano group) benzoisoxazolone derivative, and the like may be used.

Also, in order to improve the storage elasticity modulus of the first tacky-adhesive layer 12 which is cured by radial rays or heat, for example, a method in which the amount of the epoxy resin used is increased, a method in which a cross-link density of the whole polymer is increased by using an epoxy resin having a high concentration of glycidyl groups or a phenol resin having a high concentration of hydroxyl groups, or a method in which a filler is added, may be employed.

Further, in order to improve the reflow crack resistance, to the first tacky-adhesive layer 12 may be added a high molecular weight resin compatible with a heat-polymerizable component. Such a high molecular weight resin is not particularly limited, and examples thereof may include, for example, phenoxy resins, heat-polymerizable components having a high molecular weight, heat-polymerizable components having an ultrahigh molecular weight, and the like. They may be used alone or in combination thereof.

The amount of the heat-polymerizable component which is compatible with a high molecular weight resin used is preferably 40 parts by weight or less based on 100 parts by weight of the heat-polymerizable components. When the amount if within this range, it tends to be able to secure the Tg of the heat-polymerizable component layer.

Also, in order to improve the handling and the thermal conductivity, control the melt viscosity and give the thixotropic nature, to the first tacky-adhesive layer 12 may be added an inorganic filler. The inorganic filler is not particularly limited, and examples thereof may include, for example, aluminum hydroxide, magnesium hydroxide, calcium carbonate, magnesium carbonate, calcium silicate, magnesium silicate, calcium oxide, magnesium oxide, aluminum oxide, aluminum nitride, aluminum borate whisker, boron nitride, crystalline silica, non-crystalline silica, and the like. The shape of the filler is not particularly limited. These fillers may be used alone or in combination thereof.

The compound generating the base by irradiation of radial rays is a compound generating a base when the radial ray is irradiated, and the generated base accelerates a curing reaction rate of the thermosetting resin, which is also referred to as a photobase generator. As the bases generated are preferably strongly basic compounds from the viewpoint of reactivity and curing rate. In general, a pKa value, which is a log of an acid dissociation constant, is used as a parameter of basicity, and bases having a pKa value in an aqueous solution of 7 or more are preferable, more preferably 9 or more.

Also, as the above-mentioned compound generating a base by irradiation of radial rays, it is preferable to use compounds generating a base by optical illumination having a weave length of 150 to 750 nm, and it is more preferable to use compounds generating a base by optical illumination having a weave length of 250 to 500 nm, in order to efficiently generate a base when general light source is used.

Examples of the compound generating the base by irradiation of radial rays may include imidazole derivatives such as imidazole, 2,4-dimethyl imidazole, and 1-methyl imidazole; piperazine derivatives such as piperazine, and 2,5-dimethyl piperazine; piperidine derivatives such as piperidine, and 1,2-dimethyl piperidine; proline derivatives; trialkyl amine derivatives such as trimethyl amine, tirethyl amine, and triethanol amine; pyridine derivatives in which amino group or an alkyl amino group is substituted at the 4th-position such as 4-methyl aminopyridine, and 4-dimethyl aminopyridine; pyrrolidine derivatives such as pyrrolidine and n-methylpyrrolidine; alicyclic amine derivatives such as triethylene diamine, 1,8-diazabiscyclo(5,4,0)undecene-1(DBU); benzyl amine derivatives such as benzylmethyl amine, benzyldimethyl amine, and benzyldiethyl amine, and the like.

It is desirable that the thickness of the first tacky-adhesive layer 12 is within the range that while the sufficient adhesiveness to the mounting substrate is secured, the sticking operation to the semiconductor wafer and the subsequent dicing operation are not affected thereby. From this viewpoint, the thickness of the first tacky-adhesive layer 12 is preferably from 1 to 300 μm, more preferably from 5 to 150 μm, particularly preferably from 10 to 100 μm. When the thickness is less than 1 μm, it tends to become difficult to secure the sufficient die bond adhesion. When the thickness is more than 300 μm, the sticking operation and the dicing operation tend to be impaired.

As a substrate film 14 constituting the adhesive sheet 1, the same film or sheet as used in the release substrate 10 may be used. Examples thereof may include, for example, polyester films such as polyethylene terephthalate film; polyolefin films such as polytetrafluoroethylene film, polyethylene film, polypropylene film, polymethylpentene film and polyvinyl acetate film; plastic films such as polyvinyl chloride film and polyimide film, and the like. Further, as the substrate film 14, laminates composed of two or more layer of the films mentioned above may be used.

Also, the thickness of the substrate film 14 is preferably from 10 to 500 μm, more preferably from 25 to 100 μm, particularly preferably from 30 to 50 μm.

The adhesive sheet 1 has the release substrate 10, the first tacky-adhesive layer 12 and the substrate film 14, as described above. In the release substrate 10 of the adhesive sheet 1, incisions D are formed along the periphery of the plane shape of the first laminate 20 comprising the first tacky-adhesive layer 12 and the substrate film 14 from the surface of the release substrate 10 facing the first tacky-adhesive layer 12 in the thickness direction of the release substrate 10.

The incision depth d of this incision D is less than the thickness of the release substrate 10, and 25 μm or less. Here, in order to obtain a better releasability, the incision depth d is more preferably 15 μm or less, still further preferably 10 μm or less, particularly preferably 5 μm or less. As mentioned above, the closer to 0 μm the incision depth d, the better the releasability, and the depth of more than 0 μm and 0.5 μm or less is the most preferable.

When the incision depth d of the incision D is within the above-mentioned range, in the adhesive sheet 1, then the first tacky-adhesive layer 12 can be sufficiently inhibited from biting to the incision D. As a result, the interface between the release substrate 10 and the first tacky-adhesive layer 12 is not sealed, and it is easy to peel off the first laminate 20 form the release substrate 10, whereby peel defect can be sufficiently inhibited when the first laminate 20 is stuck to the adherend.

However, if the incision depth is brought close to 0 μm by using a current precut apparatus, it takes a long time for adjusting the apparatus and performing the precut processing, and, consequently, the production efficiency tends to lower. Accordingly, the incision depth d is preferably from 5 to 15 μm, form the viewpoint of the balance of the production efficiency and the inhibition of peel defect.

Also, in the adhesive sheet 1, it is preferable that a value of (d/a) satisfies a condition showing the following formula (1):

$$0<(d/a)\leq 0.7 \quad (1)$$

wherein a (μm) is a thickness of the release substrate 10.

When the value of the above-mentioned (d/a) satisfies the condition showing the above-mentioned formula (1), the first tacky-adhesive layer 12 can be sufficiently inhibited from biting to the incision D, and the peel defect can be sufficiently inhibited. In order to fully obtain such an effect, the upper limit of the value of (d/a) in the above-mentioned formula (1) is more preferably 0.5, still further preferably 0.3, particularly preferably 0.25, extremely preferably 0.15, the most preferably 0.1.

As mentioned above, the above-mentioned incision depth d refers to a value obtained by measuring a depth of an incision D formed in the release substrate 10 is measured with a cross-section observation using an electron microscope at 10 points arbitrarily selected, and averaging the obtained 10 values are averaged. It is preferable that all of the depths of 10 incisions D arbitrarily selected and measured are within the above-mentioned range, from the viewpoint of the more sufficient inhibition of the peel defect.

Second Embodiment

Figure 4:
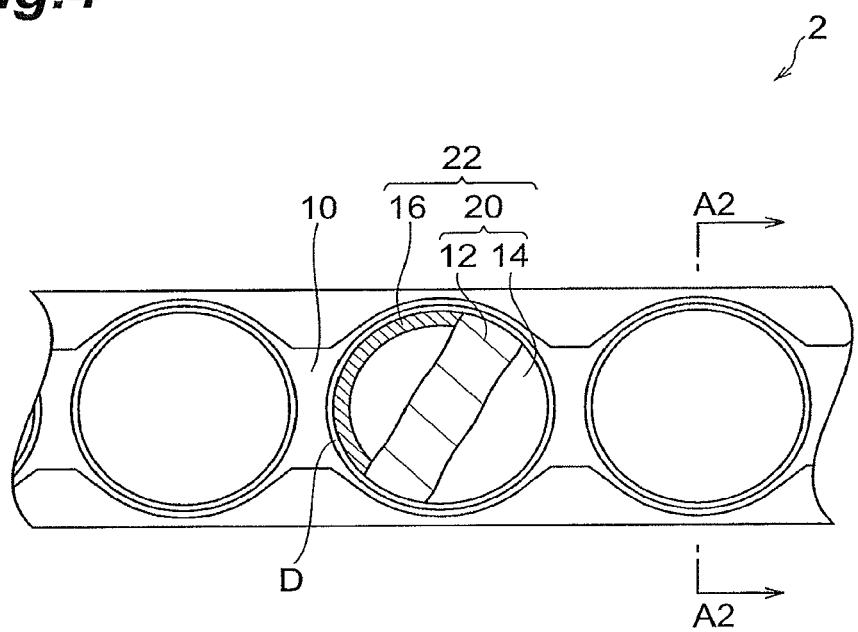
FIG. 4 is a plane view showing a second embodiment of an adhesive sheet of the present invention.
Figure 5:
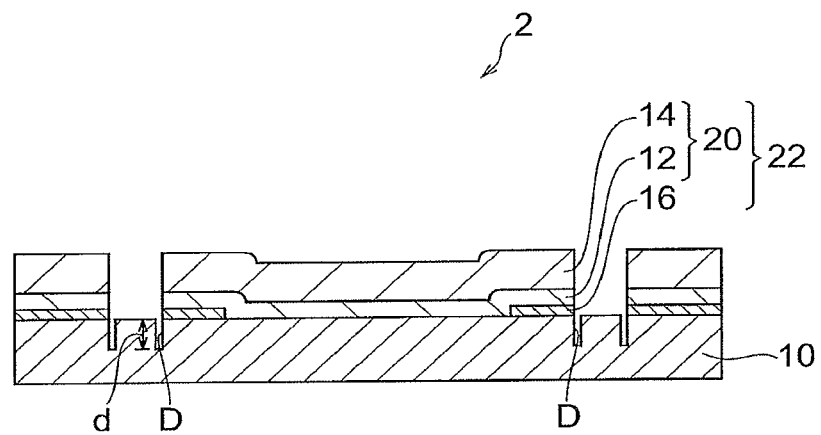
FIG. 5 is a schematic cross-section view of the adhesive sheet 2 shown in FIG. 4 which is cut along the line A2-A2 in FIG. 4.

FIG. 4 is a plane view showing a second embodiment of an adhesive sheet of the present invention, and FIG. 5 is a schematic cross-section view of the adhesive sheet 2 shown in FIG. 4 which is cut along the line A2-A2 in FIG. 4. As shown in FIG. 4 and FIG. 5, the adhesive sheet 2 has a structure comprising a release substrate 10, a first tacky-adhesive layer 12, a second tacky-adhesive layer 16 placed between a peripheral part of the first tacky-adhesive layer 12 and the release substrate 10, and a substrate film 14. Also, the first tacky-adhesive layer 12 and the substrate film 14 are cut in pre-determined plane shapes, and are partly laminated on the release substrate 10. Further, the second tacky-adhesive layer 16 is cut in a pre-determined plane shape, and is placed at a position where it will be stuck to a wafer ring when a second laminate 22 comprising the substrate film 14, the first tacky-adhesive layer 12 and the second tacky-adhesive layer 16 is stuck to a semiconductor wafer and the wafer ring. In the release substrate 10, an annular incision D is formed along a plane shape of the second laminate 22 from a surface facing the first tacky-adhesive layer 12 and the second tacky-adhesive layer 16, in a thickness direction of the release substrate 10.

In the adhesive sheet 2, a incision depth d of the incision D formed in the release substrate 10 is less than the thickness of the release substrate 10, and 25 μm or less. Also, the incision depth d of the incision D and the (d/a) has the same preferable ranges as the incision depth d and the (d/a) of the adhesive sheet 1 in the first embodiment.

When such an adhesive sheet 2 is used, the second laminate 22 is peeled off from the release substrate 10, the first tacky-adhesive layer 12 in the second laminate 22 is stuck to a semiconductor wafer, and the second tacky-adhesive layer 16 is stuck to a wafer ring.

In the adhesive sheet 2, the same materials as those described in the adhesive sheet 1 of the above-mentioned first embodiment may be used as the release substrate 10, the first tacky-adhesive layer 12 and the substrate film 14.

The second tacky-adhesive layer 16 in the adhesive sheet 2 is formed from a resin such as an acrylic resin, a rubber, or a silicone resin. The thickness of the second tacky-adhesive layer 16 is preferably from 5 to 50 μm.

When this second tacky-adhesive layer 16 is placed between the peripheral part of the first tacky-adhesive layer 12 and the release substrate 10, in other word, it is placed at a position where it will be stuck to the wafer ring when the adhesive sheet 2 is used, it is possible that the first tacky-adhesive layer 12 is not directly stick to the wafer ring. If the first tacky-adhesive layer 12 is directly stuck to the wafer ring, it is necessary to adjust the tack strength of the first tacky-adhesive layer 12 to low tack strength such that the layer is not easily peeled off from the wafer ring. However, when the second tacky-adhesive layer 16 is stuck to the wafer ring, such an adjustment of the tack strength is not necessary. Consequently, the first tacky-adhesive layer 12 can have sufficient high tack strength as well as the second tacky-adhesive layer 16 has low tack strength such that the wafer ring can be easily peeled off, whereby the dicing operation of the semiconductor wafer and the subsequent peeling operation of the wafer ring can be efficiently performed. Further, since the tack strength of the second tacky-adhesive layer 16 can be controlled sufficiently low, it is easy to generate starting points of peeling between the release substrate 10 and the second tacky-adhesive layer 16, whereby the second tacky-adhesive layer 16, the first tacky-adhesive layer 12 and the substrate film 14 can be easily peeled off from the release substrate 10, and thus the peel defect can be sufficiently inhibited.

Third Embodiment

Figure 6:
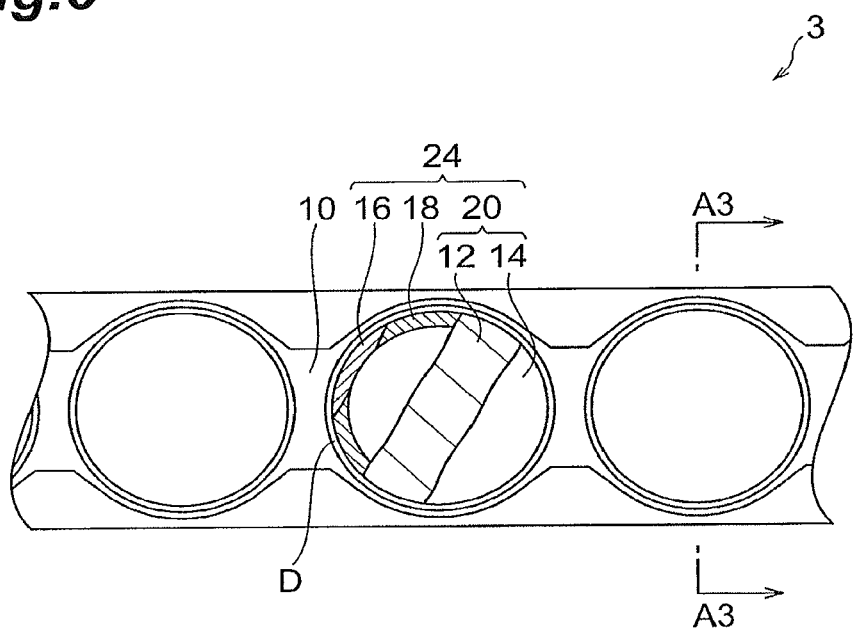
FIG. 6 is a plane view showing a third embodiment of an adhesive sheet of the present invention.
Figure 7:
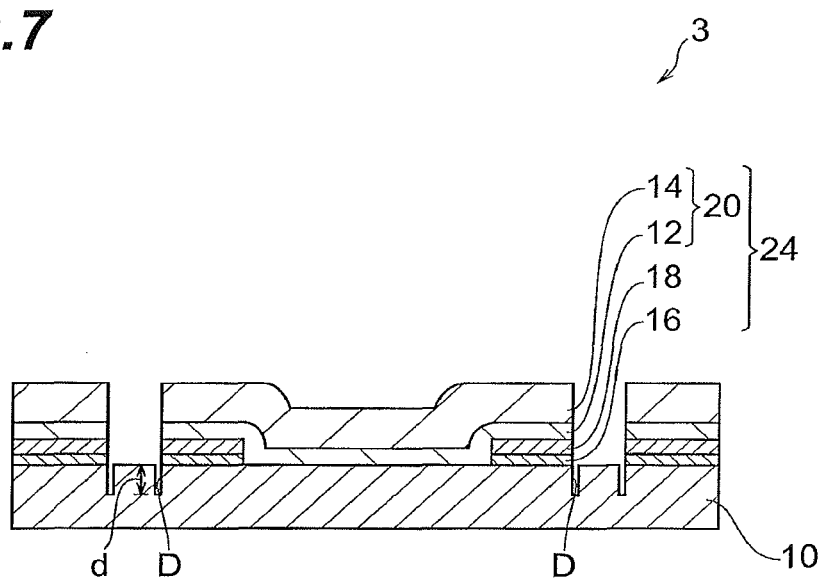
FIG. 7 is a schematic cross-section view of the adhesive sheet 3 shown in FIG. 6 which is cut along the line A3-A3 in FIG. 6.

FIG. 6 is a plane view showing a third embodiment of an adhesive sheet of the present invention, and FIG. 7 is a schematic cross-section view of the adhesive sheet 3 shown in FIG. 6 which is cut along the line A3-A3 in FIG. 6. As shown in FIG. 6 and FIG. 7, the adhesive sheet 3 has a structure comprising a release substrate 10, a first tacky-adhesive layer 12, a second tacky-adhesive layer 16 placed between a peripheral part of the first tacky-adhesive layer 12 and the release substrate 10, an intermediate layer 18 placed between the second tacky-adhesive layer 16 and a substrate film 14, and the substrate film 14. The first tacky-adhesive layer 12 and the substrate film 14 are cut in pre-determined plane shapes, and are partly laminated on the release substrate 10. Further, the second tacky-adhesive layer 16 and the intermediate layer 18 are also cut in a pre-determined plane shape, and they are placed at a position where it will be stuck to a wafer ring when a third laminate 24 comprising the substrate film 14, the first tacky-adhesive layer 12, the intermediate layer 18, and the second tacky-adhesive layer 16 is stuck to a semiconductor wafer and the wafer ring. In the release substrate 10, an annular incision D is formed along a plane shape of the second laminate 22, from a surface facing the first tacky-adhesive layer 12 and the second tacky-adhesive layer 16 in a thickness direction of the release substrate 10.

In the adhesive sheet 3, an incision depth d of the incision D formed in the release substrate 10 is less than the thickness of the release substrate 10, and 25 μm or less. The incision depth d of the incision D and the (d/a) has the same preferable ranges as the incision depth d and the (d/a) of the adhesive sheet 1 in the first embodiment.

When the adhesive sheet 3 is used, the third laminate 24 is peeled off from the release substrate 10, the first tacky-adhesive layer 12 in the third laminate 24 is stuck to the semiconductor wafer, and the second tacky-adhesive layer 16 is stuck to the wafer ring.

In the adhesive sheet 3, the same materials as those described in the adhesive sheet 1 of the above-mentioned first embodiment may be used as the release substrate 10, the first tacky-adhesive layer 12 and the substrate film 14, and the same materials as those described in the adhesive sheet 2 of the above-mentioned second embodiment may be used as the second tacky-adhesive layer 16.

As the intermediate layer 18 in the adhesive sheet 3, for example, films comprising polyethylene, polypropylene, polyvinyl chloride, polyethylene terephthalate, ethylene-vinyl acetate copolymer, ionomer resin or another engineering plastic, a plate or foil of a metal may be used. The thickness of such an intermediate layer 18 is preferably form 5 to 100 μm.

In the adhesive sheet 3, similar to the adhesive sheet 2 in the second embodiment, first, the second tacky-adhesive layer 16 is placed between the peripheral part of the first tacky-adhesive layer 12 and the release substrate 10, in other word, it is placed at a position where it will be stuck to the wafer ring when the adhesive sheet 2 is used. This gives that it is possible that the first tacky-adhesive layer 12 is directly stuck to the wafer ring. When the first tacky-adhesive layer 12 has sufficient high tack strength as well as the second tacky-adhesive layer 16 has low tack strength such that the wafer ring can be easily peeled off, the dicing operation of the semiconductor wafer and the subsequent peeling operation of the wafer ring can be more efficiently performed.

Further, in the adhesive sheet 3, since the intermediate layer 18 is placed between the second tacky-adhesive layer 16 and the first tacky-adhesive layer 12, it is possible to raise a degree of freedom of choice of materials for the second tacky-adhesive layer 16. For example when the adhesive sheet 2 of the second embodiment is produced, it is necessary to precut a second tacky-adhesive layer 16 after the second tacky-adhesive layer 16 is laminated on the release substrate 10. An inexpensive tacky-adhesive layer does not have self-supporting property, and therefore it can be difficult to completely peel off it from the release substrate 10. However, as the adhesive sheet 3, when the intermediate layer 18 is provided, it is possible to easily remove the second tacky-adhesive layer 16 together with the intermediate layer 18 on precut, whereby the efficiency of the working can be promoted as well as the degree of freedom of the choice of the material for the second tacky-adhesive layer 16 can be raised.

Production Method of Adhesive Sheet

Forth Embodiment

A method for producing the adhesive sheet 1 concerning the above-mentioned first embodiment, in accordance with the forth embodiment will be described.

Figure 8:
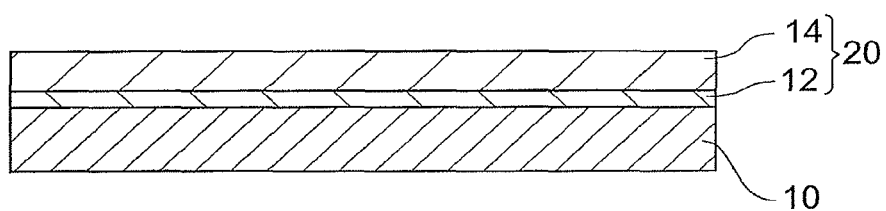
FIG. 8 is a process chart showing series of production steps of the adhesive sheet 1.
Figure 8:
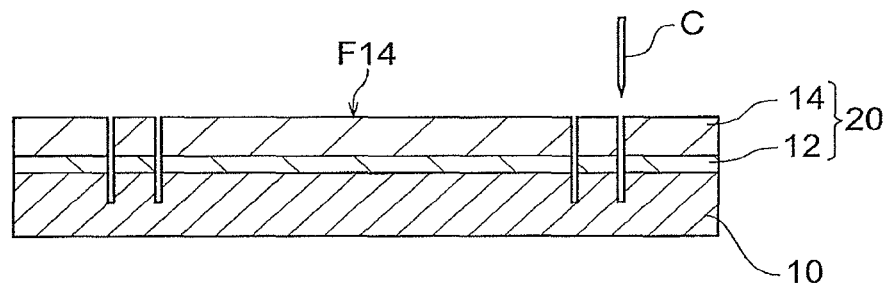
Figure 8:
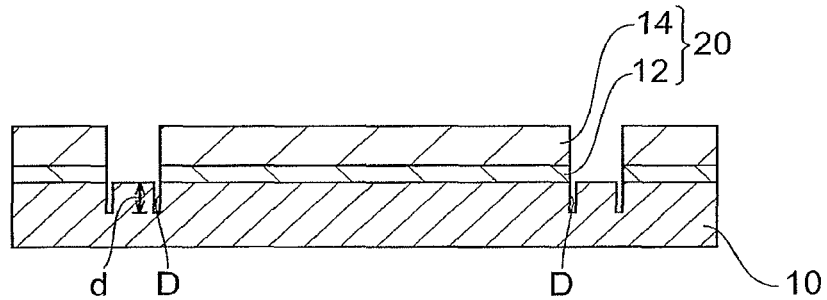

FIG. 8 is a process chart showing series of production steps of the adhesive sheet 1. As shown in FIG. 8 (a), first, the first laminate 20 comprising the first tacky-adhesive layer 12 and the substrate film 14 is laminated on the release substrate 10 (a first laminating step). Next, as shown in FIGS. 8, (b) and (c), incisions are made with a precutting blade C from an opposite surface F14 to the first tacky-adhesive layer 12 side of the substrate film 14 until the incisions reach the release substrate 10 whereby the substrate film 14 and the first tacky-adhesive layer 12 are cut in pre-determined plane shapes and the incisions D are formed in the release substrate 10 (a first cutting step). The production of the adhesive sheet 1 is completed by this operation.

Here, in the first cutting step, the incision is made so that the incision depth d of the incision D is less than the thickness of the release substrate 10 and 25 µm or less.

Now, each production step will be described in detail.

In the first laminating step, first, materials constituting the first tacky-adhesive layer 12 are dissolved or dispersed in a solvent to give a vanish for forming the first tacky-adhesive layer, and the vanish is coated on the substrate film 14, and after that, the solvent is removed by heating to form the first laminate 20.

Here, the above-mentioned solvents used in the production of vanish are not particularly limited, so long as they can solve or disperse various constituting materials. In view of the volatility upon formation of layers, it is preferable to use solvents having a relatively low boiling point such as methanol, ethanol, 2-methoxyethanol, 2-ethoxyethanol, 2-butoxyethanol, methyl ethyl ketone, acetone, methyl isobutyl ketone, toluene, and xylene. In order to improve the coating property, solvents having a relatively high boiling point such as dimethyl acetoamide, dimethylformamide, N-methylpyrrolidone, and cyclohexanone can be used. These solvents may be used alone or in combination thereof. It is also possible to remove bubbles from the vanish by vacuum exhausting after producing the vanish.

For coating the vanish on the substrate film 14, known method may be used, and for example, a knife coating method, a roll coating method, a spray coating method, a gravure coating method, a bar coating method, a curtain coating method, and the like may be used.

Next, the first laminate 20 produced as above and the release substrate 10 are laminated. Hereby the adhesive sheet before precut (hereinafter referred to as a "precursor sheet") is formed to complete the first laminating step.

Here, the lamination of the first laminate 20 and the release substrate 10 may be performed in a conventional known manner such as a method in which a laminator is used.

Also, the precursor sheet can be produced by the following method. For example, a method in which after the vanish for forming the first tacky-adhesive layer is coated on the release substrate 10, the solvent is removed by heating to form the first tacky-adhesive layer 12, and then the substrate film 14 is stuck to the obtained first tacky-adhesive layer 12 using a laminator, or the like may be employed.

In the first cutting step, the incisions are made in the precursor sheet obtained as above from an opposite surface F14 to the first tacky-adhesive layer 12 side of the substrate film 14 until the incisions reach the release substrate 10, whereby the first laminate 20 comprising the first tacky-adhesive layer 12 and the substrate film 14 in a pre-determined plane shape and the incision D is formed in the release substrate 10.

Here, the cutting of the first laminate 20 can be performed using a precutting blade C having a shape corresponding to the pre-determined plane shape.

In the first cutting step, the incision is made so that the incision depth d of the incision D is less than the thickness of the release substrate 10 and 25 µm or less. In order to obtain the adhesive sheet 1 having better releasability, it is more preferable that the incision depth d of the incision D is 15 µm or less, still further preferably 10 µm or less, particularly preferably 5 µm or less. As mentioned above, the closer to 0 µm the incision depth d, the better the releasability, and the depth of more than 0 µm and 0.5 µm or less is the most preferable. However, form the viewpoint of the balance of the production efficiency and the inhibition of peel defect, the incision depth d is preferably from 5 to 15 µm.

Also, in the first cutting step, it is preferable that a value of (d/a) satisfies a condition showing the following formula (1):

$$0 < (d/a) \leq 0.7 \tag{1}$$

wherein a (µm) is a thickness of the release substrate 10.

This gives that the adhesive sheet 1 capable of sufficiently inhibiting the peel defect can be obtained. In order to fully obtain such an effect, the upper limit of the value of (d/a) in the above-mentioned formula (1) is more preferably 0.5, still further preferably 0.3, particularly preferably 0.25, extremely preferably 0.15, the most preferably 0.1.

After that, if necessary, an unnecessary part is peeled off and removed from the first laminate 20 to obtain the desired adhesive sheet 1.

Fifth Embodiment

A method for producing the adhesive sheet 2 concerning the above-mentioned second embodiment in accordance with the fifth embodiment will be described.

Figure 9:
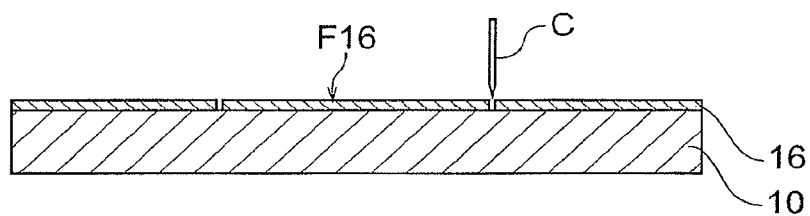
FIG. 9 is a process chart showing series of production steps of the adhesive sheet 2.
Figure 9:
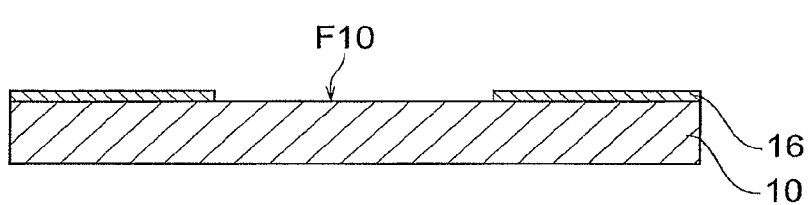
Figure 9:
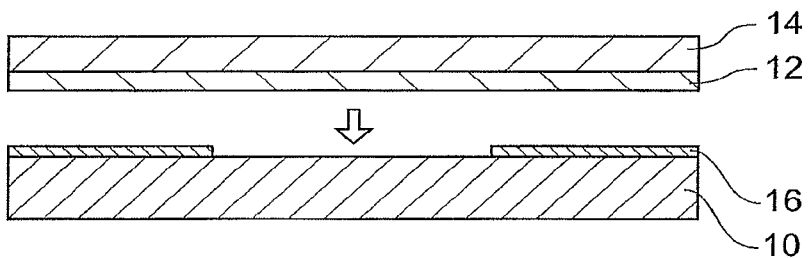
Figure 9:
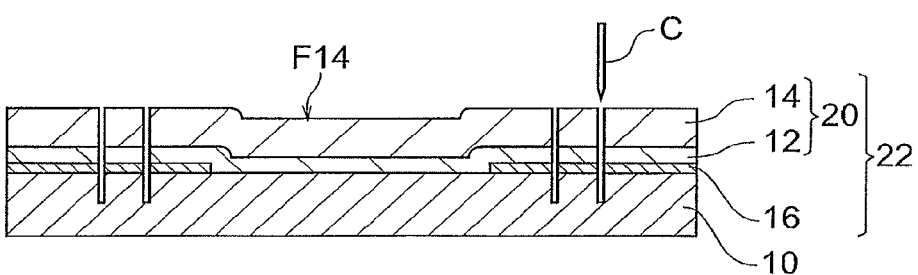
Figure 9:
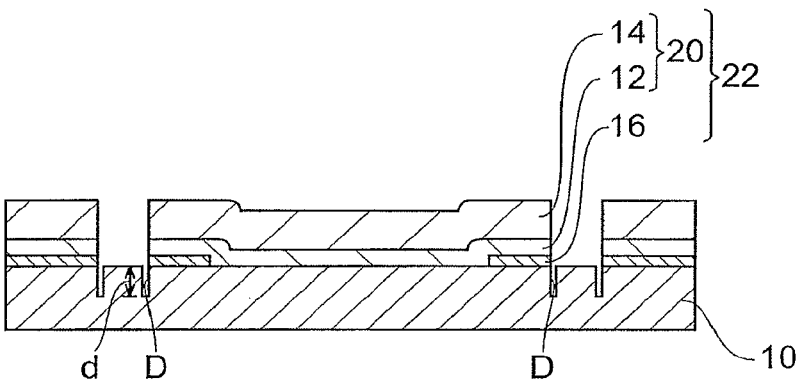

FIG. 9 is a process chart showing series of production steps of the adhesive sheet 2. As shown in FIG. 9 (a), first, the second tacky-adhesive layer 16 is laminated on the release substrate 10. Next, incision are made in the second tacky-adhesive layer 16 using a precutting blade C, and the second tacky-adhesive layer 16 is partly removed to form, as shown in FIG. 9 (b), an exposed surface F10 on side of the release substrate 10 facing the second tacky-adhesive layer 16 (a second laminating step). After that, as shown in FIG. 9 (c), the first tacky-adhesive layer 12 and the substrate film 14 are laminated on the exposed surface F10 of the release substrate 10 and the second tacky-adhesive layer 16 (a third laminating step). Next, as shown in FIG. 9 (d) and (e), incisions are made with a precutting blade C from an opposite surface F14 to the first tacky-adhesive layer 12 in the substrate film 14 until the incisions reach the release substrate 10, whereby the substrate film 14, the first tacky-adhesive layer 12 and the second tacky-adhesive layer 16 are cut in pre-determined plane shapes as well as the incision D is formed in the release substrate 10 (a second cutting step). The production of the adhesive sheet 2 is completed by this operation.

Here, in the second cutting step, the first tacky-adhesive layer 12 is brought contact with the exposed surface F10 of the release substrate 10 within a range of the above-mentioned pre-determined plane shape (within the range of the inside of the above-mentioned incision D), and the cutting is performed at a peripheral part within the above-mentioned range so that the first tacky-adhesive layer 12 is brought contact with the second tacky-adhesive layer 16 as well as the incisions are made so that the incision depth d of the incision D is less than the thickness of the release substrate 10 and 25 µm or less.

Now, each production step will be described in detail.

In the second laminating step, materials constituting the second tacky-adhesive layer 16 are dissolved or dispersed in a solvent to give a vanish for forming the second tacky-adhesive layer, and the vanish is coated on the substrate film 14, and after that, the solvent is removed by heating to form the second tacky-adhesive layer 16.

Subsequently, the incision are made in the second tacky-adhesive layer 16 as obtained above using a precutting blade C from an opposite surface F16 to the release substrate 10 of the second tacky-adhesive layer 16 until the incisions reach the release substrate 10, and the second tacky-adhesive layer 16 is partly removed from the release substrate 10 to form an exposed surface F10 on side of the release substrate 10 facing the second tacky-adhesive layer 16. By this operation, the second tacky-adhesive layer 16 is partly laminated on the release substrate 10 to complete the second laminating step.

In the third laminating step, first, materials constituting the first tacky-adhesive layer 12 are dissolved or dispersed in a solvent to give a vanish for forming the first tacky-adhesive layer, and the vanish is coated on the substrate film 14, and after that, the solvent is removed by heating to form the second laminate 20. Here, the first laminate 20 can be produced in the same manner as in the above-mentioned forth embodiment.

Next, the first laminate 20 obtained as above is laminated on the exposed surface F10 of the release substrate 10 and the second tacky-adhesive layer 16. By this operation, the adhesive sheet before precut (the precursor sheet) is formed and the third laminating step is completed.

In the second cutting step, the incisions are made in the precursor sheet obtained above from the opposite surface F14 to the first tacky-adhesive layer 12 of the substrate film 14 until the incisions reach the release substrate 10, whereby the substrate film 14, the first tacky-adhesive layer 12 and the second tacky-adhesive layer 16 are cut in pre-determined plane shapes as well as the incision D is formed in the release substrate 10.

Here, the cutting of the substrate film 14, the first tacky-adhesive layer 12 and the second tacky-adhesive layer 16 can be performed using a precutting blade C having a shape corresponding to the pre-determined plane shape.

The preferable range of the incision depth d of the incision D formed in this second cutting step and the (d/a) are the same as in the above-mentioned forth embodiment.

After that, if necessary, unnecessary parts are peeled off and removed from the substrate film 14, the first tacky-adhesive layer 12 and the second tacky-adhesive layer 16 to obtain the desired adhesive sheet 2 wherein the second laminate 22 comprising the second tacky-adhesive layer 16, the first tacky-adhesive layer 12 and the substrate film 14 is laminated on the release substrate 10.

Sixth Embodiment

A method for producing the adhesive sheet 3 concerning the above-mentioned third embodiment in accordance with the sixth embodiment will be descried.

Figure 10:
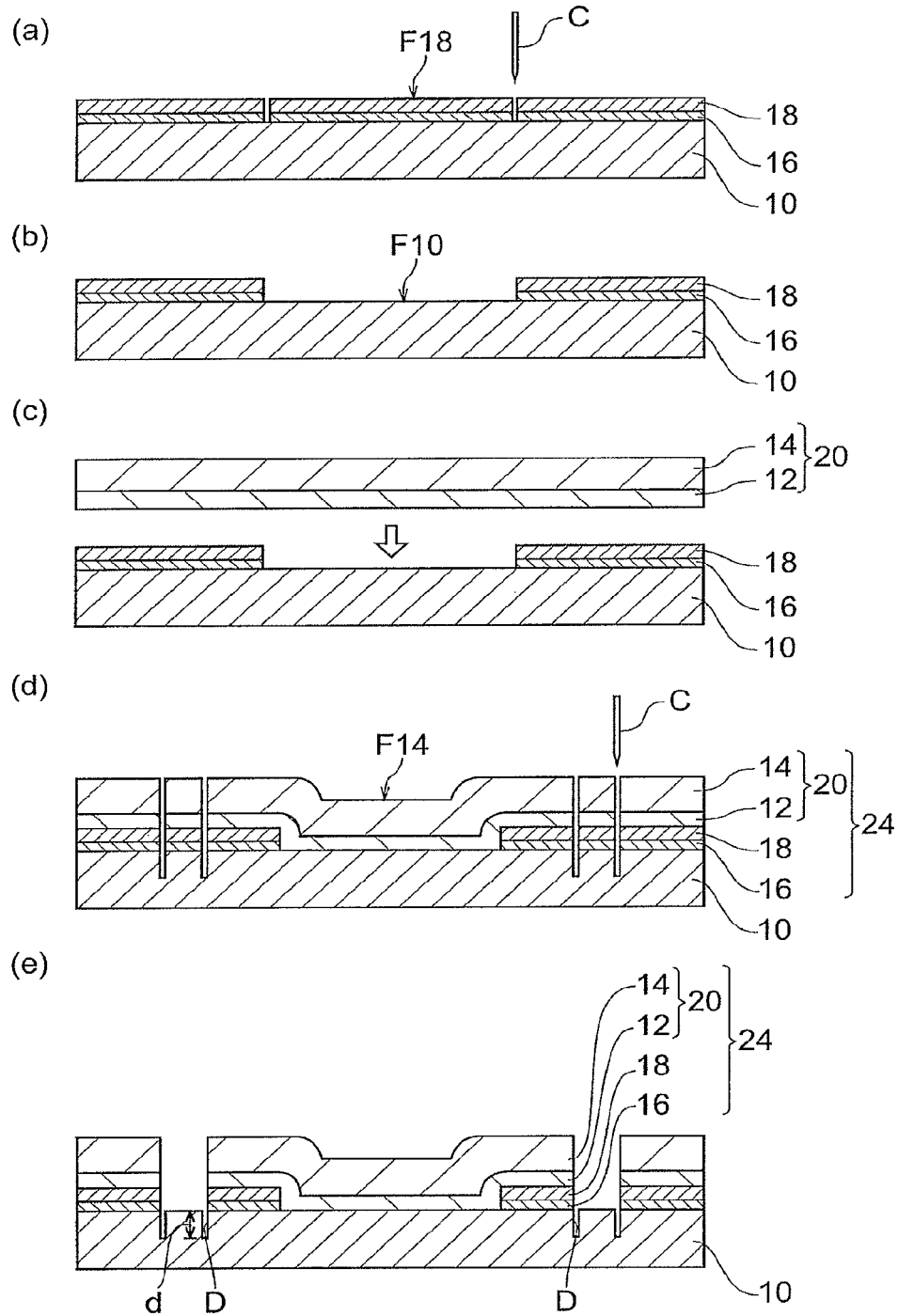
FIG. 10 is a process chart showing series of production steps of the adhesive sheet 3.

FIG. 10 is a process chart showing series of production steps of the adhesive sheet 3. As shown in FIG. 10 (a), first, the second tacky-adhesive layer 16 and the intermediate layer 18 are laminated on the release substrate 10. Next, incisions are made in the second tacky-adhesive layer 16 and the intermediate layer 18 with a precutting blade C, and the second tacky-adhesive layer 16 and the intermediate layer are partly removed to form, as shown in FIG. 10 (b), an exposed surface F10 facing the second tacky-adhesive layer 16 of the release substrate 10 (a fourth laminating step). After that, as shown in FIG. 10 (c), the first tacky-adhesive layer 12 and the substrate film 14 are laminated on the exposed surface F10 of the release substrate 10 and the intermediate layer 18 (a fifth laminating step). Next, as shown in FIG. 10 (d) and (e), incisions are made with a precutting blade C from an opposite surface F14 to the first tacky-adhesive layer 12 of the substrate film 14 until the incisions reach the release substrate 10, whereby the substrate film 14, the first tacky-adhesive layer 12, the intermediate layer 18 and the second tacky-adhesive layer 16 are cut in pre-determined plane shapes as well as the incisions D are formed on the release substrate 10 (a third cutting step). By this operation, the production of the adhesive sheet 3 is completed.

Here, in the third cutting step, the first tacky-adhesive layer 12 is brought contact with the exposed surface F10 of the release substrate 10 within a range of the above-mentioned pre-determined plane shape (within the range of the inside of the above-mentioned incision D), and the cutting is performed at a peripheral part within the above-mentioned range so that the first tacky-adhesive layer 12 is brought contact with the intermediate layer 18 as well as the incision are made so that the incision depth d of the incision D is less than the thickness of the release substrate 10 and 25 μm or less.

Now, each production step will be described in detail.

In the forth laminating step, materials constituting the second tacky-adhesive layer 16 are dissolved or dispersed in a solvent to give a vanish for forming the second tacky-adhesive layer, and the vanish is coated on the release substrate 10, and after that, the solvent is removed by heating to form the second tacky-adhesive layer 16. Next, materials constituting the intermediate layer 18 are dissolved or dispersed in a solvent to give a vanish for forming the intermediate layer, and the vanish is coated on the second tacky-adhesive layer 16, and after that, the solvent is removed by heating to form the intermediate layer 16.

Subsequently, incisions are made in the second tacky-adhesive layer 16 and the intermediate layer 18 obtained above with a precutting blade C from an opposite surface F18 to the second tacky-adhesive layer 16 of the intermediate layer 18 until the incisions reach the release substrate 10, and the second tacky-adhesive layer 16 and the intermediate layer 18 are partly removed from the release substrate 10, whereby an exposed surface F10 is formed on a surface of the release substrate 10 facing the second tacky-adhesive layer 16. By this operation, the second tacky-adhesive layer 16 and the intermediate layer 18 are partly laminated on the release substrate 10, and the forth laminating step is completed.

In the fifth laminating step, first, materials constituting the first tacky-adhesive layer 12 are dissolved or dispersed in a solvent to give a vanish for forming the first tacky-adhesive layer, and the vanish is coated on the substrate film 14, and after that, the solvent is removed by heating to form the first laminate 20. Here, the first laminate 20 can be produced in the same manner as in the above-mentioned forth 4 embodiment.

Next, the first laminate 20 produced above is laminated on the exposed surface F10 of the release substrate 10 and the intermediate layer 18. By this operation, the adhesive sheet before precut (the precursor sheet) is formed and the fifth laminating step is completed.

In third cutting step, the incisions are made in the precursor sheet obtained above from the opposite surface F14 to the first tacky-adhesive layer 12 of the substrate film 14 until the incisions reach the release substrate 10, whereby the substrate film 14, the first tacky-adhesive layer 12, the intermediate layer 18 and the second tacky-adhesive layer 16 are cut in pre-determined plane shapes as well as the incisions D are formed in the release substrate 10.

Here, the cutting of the substrate film 14, the first tacky-adhesive layer 12, the intermediate layer 18 and the second tacky-adhesive layer 16 can be performed using a precutting blade C having a shape corresponding to the pre-determined plane shape.

The preferable range of the incision depth d of the incision D formed in this third cutting step and the (d/a) are the same as in the above-mentioned forth embodiment.

After that, if necessary, unnecessary parts are peeled off and removed from the substrate film 14, the first tacky-adhesive layer 12, the intermediate layer 18 and the second tacky-adhesive layer 16 to obtain the desired adhesive sheet 3 in which the third laminate 24 comprising the second tacky-adhesive layer 16, the intermediate layer 18, the first tacky-adhesive layer 12 and the substrate film 14 is formed on the release substrate 10.

As mentioned above, the preferable embodiments of the adhesive sheets of the present invention and the method for producing the adhesive sheet were descried in detail, but the present invention is not limited to these embodiment.

[Production Method of Semiconductor Device]

A method for producing a semiconductor device using the adhesive sheet described above will be described using FIGS. 11 and 12. In the following description, a case in which as an adhesive sheet, the adhesive sheet 2 in the above-mentioned second embodiment is used will be described.

Figure 11:
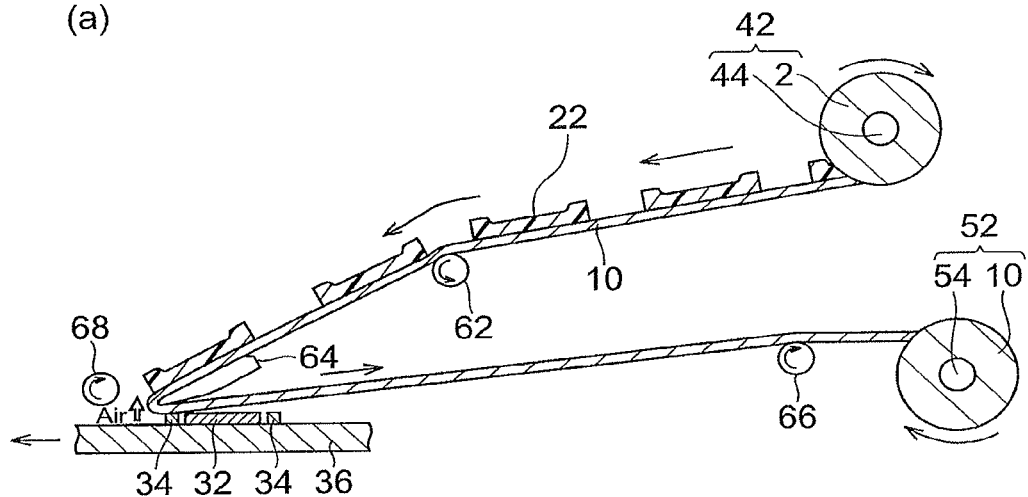
FIG. 11 is a process chart showing series of steps for sticking a second laminate 20 to a semiconductor wafer 32.
Figure 11:
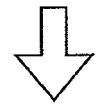
Figure 11:
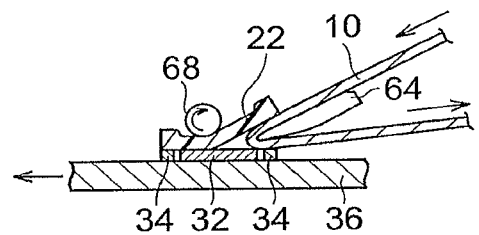
Figure 11:
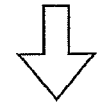
Figure 11:
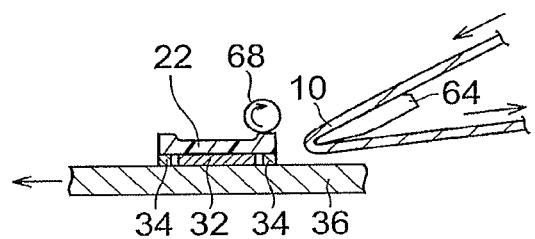

FIG. 11 is a process chart showing series of steps for sticking a second laminate 22 of the adhesive sheet 2 to a semiconductor wafer 32. As shown in FIG. 11 (a), in the adhesive sheet 2, the release substrate 10 serves as a carry film, and the sheet 2 is supported by two rolls 62 and 66, and a cuneate member 64. The adhesive sheet 2 is wound in a state in which its one end is attached to a cylindrical core 44 to form a first roll 42, and its other end is attached to a cylindrical core 54 to form a second roll 52. To the core 54 of the second roll 52 is attached a core driving motor for rotating the core 54 (not shown in Fig.). This gives that after the second laminate 22 of the adhesive sheet 2 is peeled off, the resulting release substrate 10 is wound around the core 54 at a pre-determined speed.

First, when the core driving motor is rotated, the core 54 of the second roll 52 is rotated, whereby the adhesive sheet 2 wound around the core 44 of the first roll 42 is drawn outward from the first roll 42. The drawn adhesive sheet 2 is introduced on the disc-shaped semiconductor wafer 32 placed on the mobile stage 36, and the wafer ring 34 placed so as to surround the semiconductor wafer 32.

Next, the second laminate 22 comprising the substrate film 14, the first tacky-adhesive layer 12 and the second tacky-adhesive layer 16 is peeled off from the release substrate 10. At this time, the cuneate member 64 is brought contact with the release substrate 10 from the release substrate 10 side of the adhesive sheet 2, whereby the release substrate 10 is bent to the member 64 side at a sharp angle. As a result, base points for peeling are formed between the release substrate 10 and the second laminate 22. Further, in order to more efficiently form the base points for peeling, air is blown at a boundary surface between the release substrate 10 and the second laminate 22.

After base points for peeling are formed between the release substrate 10 and the second laminate 22, as mentioned above, to which the second laminate 22 is stuck so that the second tacky-adhesive layer 16 closely contacts the wafer ring 34 and the first tacky-adhesive layer 12 closely contacts the semiconductor wafer 32, as shown in FIG. 11 (b). At this time, the second laminate 22 is joined with pressure to the semiconductor wafer 32 and the wafer ring 34 by the roll 68. After that, as shown in FIG. 11 (c), the lamination of the second laminate 22 on the semiconductor wafer 32 and the wafer ring 34 is completed.

According to the above-mentioned procedure, the lamination of the second laminate 22 to the semiconductor wafer 32 can be continuously performed in an automatic step. Examples of the apparatus for laminating the second laminate 22 to the semiconductor wafer, used in the above-mentioned procedure, may include, for example, RAD-2500™ manufactured by Lintec Corporation, and the like.

When the second laminate 22 is stuck to the semiconductor wafer 32 according to this step, the base points for peeling between the release substrate 10 and the second laminate 22 (the bases points for peeling between the release substrate 10 and the second tacky-adhesive layer 16) can be easily formed by using the adhesive sheet 2, and therefore the occurrence of the peel defect can be fully inhibited.

Figure 12:
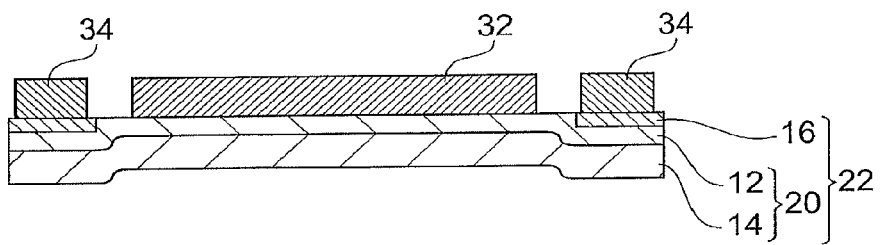
FIG. 12 is a process chart showing series of steps for dicing the semiconductor wafer 32.
Figure 12:
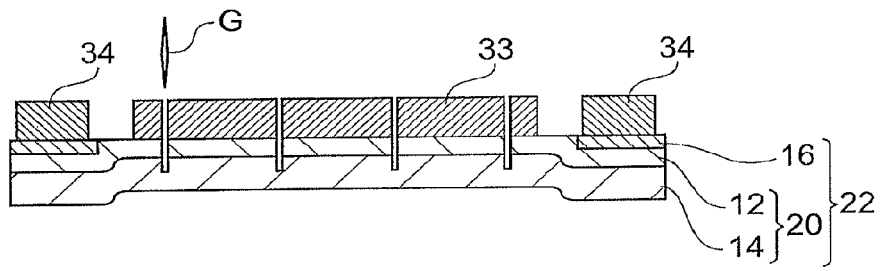
Figure 12:
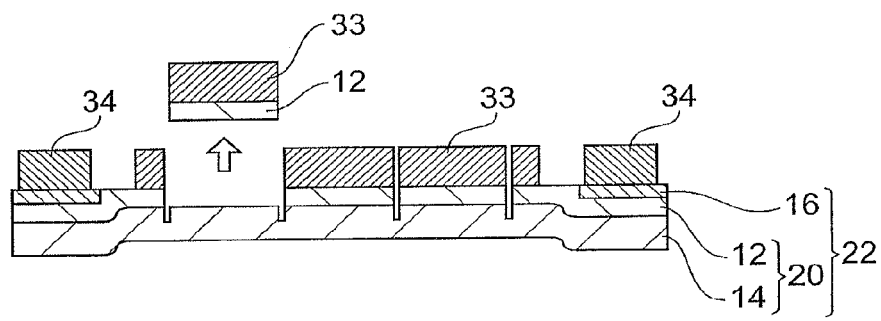
Figure 12:
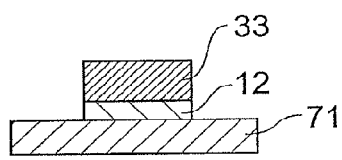

Next, the semiconductor wafer 32 on which the second laminate 22 is laminated in the above-mentioned step (FIG. 12 (a)) is diced, as shown in FIG. 12 (b), with a dicing blade G into a necessary size to obtain a semiconductor element 33 to which the first tacky-adhesive layer 12 adheres. Further, in this process, steps for drying or washing or the like may be performed. At this time, since the semiconductor wafer 32 is sufficiently stuck and held to the substrate film 14 through the first tacky-adhesive layer 12, falling of the semiconductor wafer 32 and the diced semiconductor element 33 is sufficiently inhibited during the above-mentioned steps.

Next, high energy beams such as radial rays are irradiated to the first tacky-adhesive layer 12 to cure a part of the first tacky-adhesive layer 12 with polymerization. In this case, in order to accelerate the curing reaction, the layer may be heated at the same time of after the irradiation of the high energy beams.

The high energy beams are irradiated to the first tacky-adhesive layer 12 from a surface where the first tacky-adhesive layer 12 of the substrate film 14 is not formed. It is necessary that the substrate film 14 is light-transmissive, when ultraviolet ray is used as the high energy beams, accordingly. When electron beam is used as the high energy beams, the substrate film 14 is not necessary light-transmissive.

After the irradiation of the high energy beams, as shown in FIG. 12 (c), semiconductor element 33 to be picked-up is picked-up with, for example, a suction collet. At this time, the semiconductor element 33 to be picked-up can be knocked up with, for example, a needle rod from the under surface of the substrate film 14. By curing the first tacky-adhesive layer 12, the peeling easily occurs at an interface between the first tacky-adhesive layer 12 and the substrate film 14, when the semiconductor element 33 is picked-up, and the picking-up is performed in the state in which the first tacky-adhesive layer 12 adheres to the under surface of the semiconductor element 33.

Next, as shown in FIG. 12 (d), the semiconductor element 33 to which the first tacky-adhesive layer 12 adheres is mounted on the support member for mounting a semiconductor element 71 through the first tacky-adhesive layer 12, which is heated. The adhesion of the first tacky-adhesive layer 12 is expressed by heating, and the adhesion between the semiconductor element 33 and the support member for mounting a semiconductor element 71 is completed.

After that, if necessary, a wire stick step and a sealing step are performed to produce a semiconductor device.

[Semiconductor Device]

Figure 13:
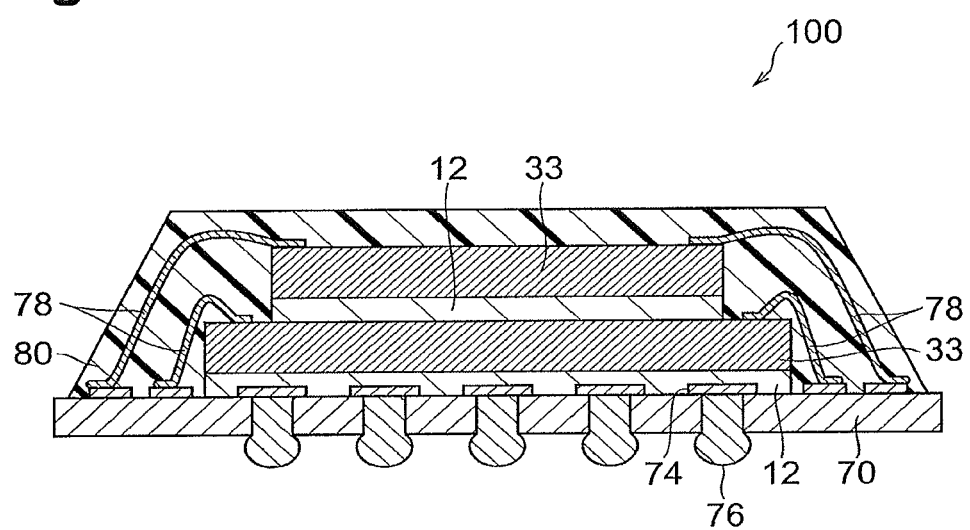
FIG. 13 is schematic cross-section view showing one embodiment of a semiconductor element of the present invention.
Figure 14:
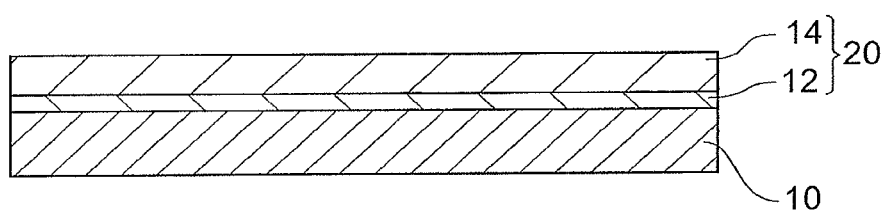
FIG. 14 is a process chart showing series of steps for performing a precut processing to a mono-layered adhesive sheet.
Figure 14:
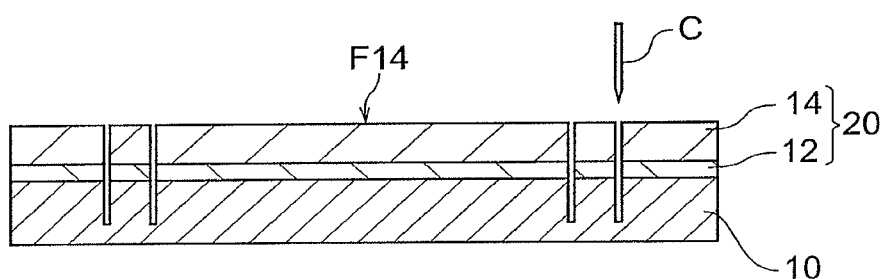
Figure 14:
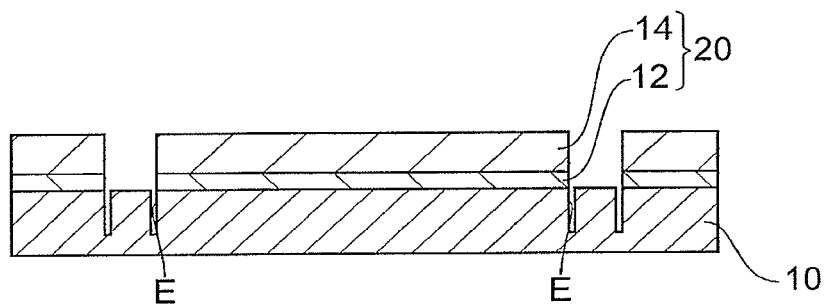
Figure 15:
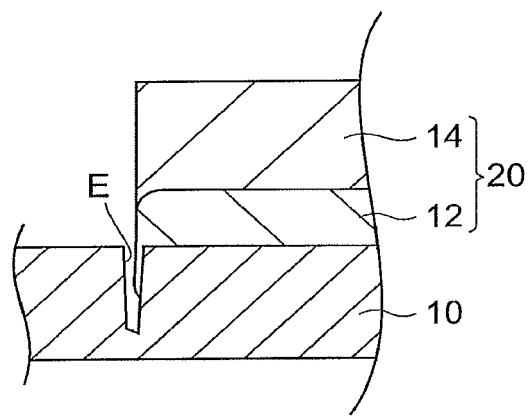
FIG. 15 is an enlarged schematic cross-section view of the vicinity of an incision E formed on a release substrate 10 according to the conventional precut processing.

FIG. 13 is schematic cross-section view showing one embodiment of a semiconductor element of the present invention produced according to the above-mentioned production method of the semiconductor device.

As shown in FIG. 13, in a semiconductor device 100, two semiconductor elements 33 is laminated on an organic substrate 70, which will be a support member for mounting a semiconductor element, through a first tacky-adhesive layer 12. On an organic substrate are formed a circuit pattern 74 and a terminal 76. The circuit pattern is attached to the two semiconductor element 33 with a wire stick 78. These are sealed with a sealer 80 to form the semiconductor device 100. The semiconductor device 100 is produced using the adhesive sheet 2 produced by the method for producing a semiconductor device of the above-mentioned present invention.

Although the preferable embodiments of the method for producing the semiconductor device of the present invention and the semiconductor device were described in detail as above, the present invention is not limited to these embodiments. For example, in the embodiment in which the adhesive sheet 2 is used in the method for producing a semiconductor device was described above, the adhesive sheet 1 or the adhesive sheet 3 may be used as the adhesive sheet.

Adhesive Sheet

Seventh Embodiment

Figure 16:
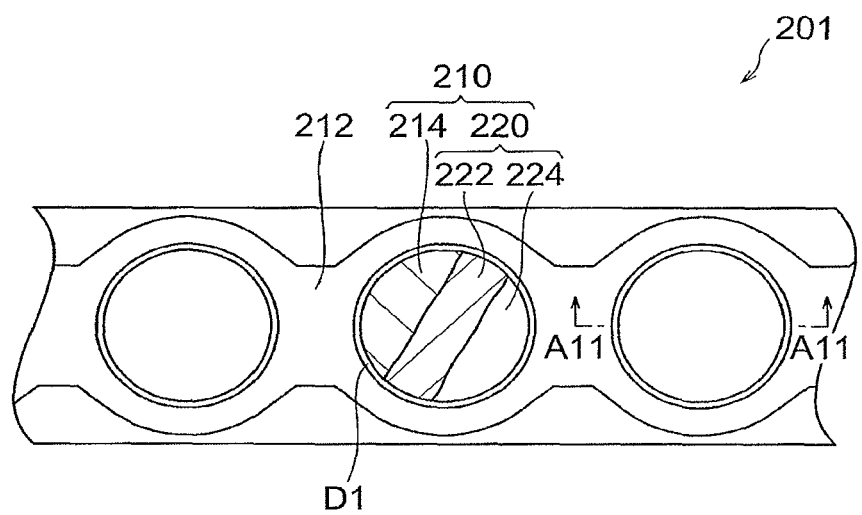
FIG. 16 is a plane view showing a seventh embodiment of an adhesive sheet of the present invention.
Figure 17:
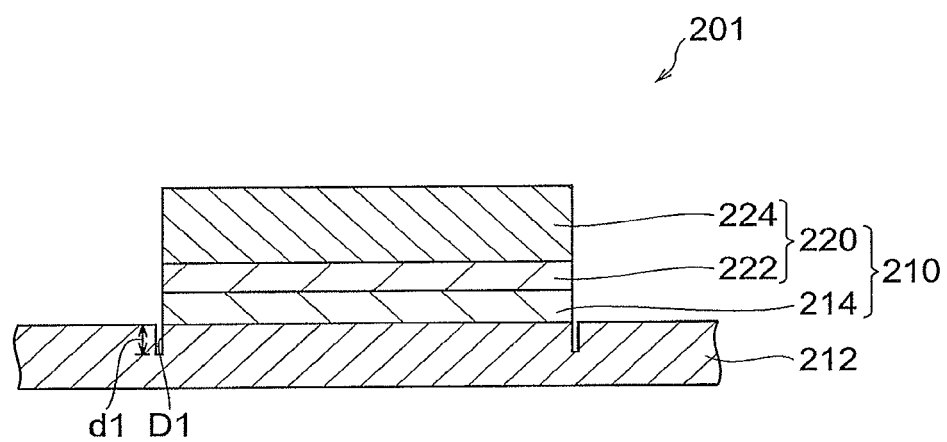
FIG. 17 is a schematic cross-section view of the adhesive sheet 201 shown in FIG. 16 which is cut along the line A11-A11 in FIG. 16.

FIG. 16 is a plane view showing a seventh embodiment of an adhesive sheet of the present invention, and FIG. 17 is a schematic cross-section view of the adhesive sheet 201 shown in FIG. 16 which is cut along the line A11-A11 in FIG. 16. As shown in FIG. 16 and FIG. 17, an adhesive sheet 201 has a structure in which a release substrate 212, an adhesive layer 214, a tacky layer 222 and a substrate film 224 are laminated in order. A laminate 210 comprising the adhesive layer 214, and a tacky film 220 comprising the tacky layer 222 and the substrate film 224 are cut in pre-determined plane shapes, and they are partly laminated on the release substrate 212. Further, in the release substrate 212, a first incision D1 is formed along a periphery of a plane shape of the laminate 210 from a surface bringing contact with the adhesive layer 214 in a thickness direction of the release substrate 212.

Here, the above-mentioned pre-determined plane shape of the laminate 210 is not particularly limited so long as the laminate 210 is partly laminated on the release substrate 212. It is preferable that the above-mentioned pre-determined plane shape of the laminate 210 is the same as the pre-determined plane shape of the first laminate 20.

In the adhesive sheet 201, an incision depth d1 of the first incision D1 formed on release substrate 212 is less than the thickness of the release substrate 212 and 25 μm or less.

When such an adhesive sheet 201 is used, the laminate 210 is peeled off form the release substrate 212, and the laminate 210 is stuck to an adherend such as a semiconductor wafer through the adhesive layer 214.

Now each layer constituting the adhesive sheet 201 will be described in detail.

The release substrate 212 serves as a carry film when the adhesive sheet 201 is used. As the release substrate 212, the same material as in the release substrate 10 may be used.

Also, it is preferable that the surface bringing contact with the adhesive layer 214 of the release substrate 212 is surface-treated with a release agent such as a silicone releasing agent, a fluorine-containing releasing agent, a long-chain alkyl acrylate releasing agent.

The thickness of the release substrate 212 may be suitably selected within a range where the workability upon using is not impaired, and the thickness is preferably 10 to 500 μm, more preferably 25 to 100 μm, particularly preferably 30 to 50 μm.

In the adhesive layer 214, known thermosetting adhesive agents, photocurable adhesive agents, thermoplastic adhesive agents and oxygen-reactive adhesive agents may be used. They may be used alone or in combination thereof.

As the above-mentioned thermoplastic adhesive agent, resins having thermal plasticity, and resins having thermal plasticity at least in its uncured state and forming a cross-linked structure after heating can be used. Examples of such a resin may include, for example, polyimide resins, polyamide resins, polyether imide resins, polyamide imide resins, polyester resins, polyester imide resins, phenoxy resins, polysulfone resins, polyether sulfone resins, polyphenylene sulfide resins, polyether ketone resins, and the like. Polymers including a functional monomer as a monomer unit may be used. Examples of the functional group in the functional monomer may include glycidyl group, acryloyl group, methacryloyl group, hydroxyl group, carboxyl group, isocyanurate group, amino group, amido group, and the like. More specifically, glycidyl group-containing (meth)acrylic copolymers including a functional monomer such as glycidyl acrylate or glycidyl methacrylate as a monomer unit may be used. In the present invention, the (meth)acrylic copolymer includes both of acrylic copolymer and methacrylic copolymer.

As the above-mentioned glycidyl group-containing (meth)acrylic copolymer, for example, (meth)acrylic ester copolymers and acrylic rubbers may be used, and the acrylic rubbers are more preferable. The acrylic rubber comprises, as a main component, an acrylic ester, which is a rubber mainly comprising a copolymer including butyl acrylate and acrylonitrile, or a copolymer including ethyl acrylate and acrylonitrile. Examples of the glycidyl group-containing (meth) acrylic copolymer may include, for example, HTR-860P-3™ manufactured by Nagase Chemtex Corporation, and the like.

Examples of the above-mentioned functional monomer other than glycidyl acrylate and glycidyl methacrylate may include, for example, ethyl(meth)acrylate, butyl (meth)acrylate, and the like. They may be alone or in combination thereof. In the present invention, the ethyl(meth)acrylate includes both ethyl acrylate and ethyl methacrylate.

The above-mentioned thermosetting adhesive agents are not particularly limited so long as they are thermosetting resins which are cured by heating to show adhesive action. Examples thereof includes compounds having a functional group such as glycidyl group, acryloyl group, methacryloyl group, hydroxyl group, carboxyl group, isocyanurate group, amino group, or amido group. They may be used alone or in combination thereof. More specifically, example thereof include epoxy resins, acrylic resins, silicone resins, phenol resins, thermosetting polyimide resins, polyurethane resins, melamine resins, urea resins, and the like.

The above-mentioned epoxy resins are not particularly limited so long as they are cured to show adhesive action. For example, difunctional epoxy resins such as bisphenol A type epoxy resins, novolac type epoxy resins such as phenol-novolac type epoxy resin and cresol novolac type epoxy resin may be used. Generally known resins such as polyfunctional epoxy resins, glycidyl amine type epoxy resins, heteroring-containing epoxy resins, and alicyclic epoxy resins may also be used. They may be used alone or in combination thereof.

When the epoxy resin is used, it is preferable to use a curing agent for epoxy resin. As the curing agent for epoxy resin may be used known curing agents generally used, and examples thereof include amines, polyamides, acid anhydrides, polysulfides, boron trifluorides, dicyandiamides, bisphenols including two or more phenolic hydroxyl groups in one molecule such as bisphenol A, bisphenol F, and bisphenol S, phenol resins such as phenol-novolac resins, bisphenol A-novolac resins and creosol novolac resin, and the like. These curing agents for epoxy resin may be used alone or in combination thereof.

It is desirable that the thickness of the adhesive layer 214 is adjusted to a range in which the adhesive strength to a substrate for mounting is fully secured as well as the laminating operation to a semiconductor wafer and the subsequent dicing operation are not affected. From these viewpoints, the thickness of the adhesive layer 214 is preferably from 1 to 300 μm, more preferably from 5 to 150 μm, particularly preferably from 10 to 100 μm. When the thickness is less than 1 μm, it tends to become difficult to secure sufficient die bond adhesive strength. When the thickness is more than 300 μm, failures such as affection to a dicing operation tend to generate.

The tacky film 220 is has a structure in which the tacky layer 222 is formed on the substrate film 224.

As the substrate film 224 constituting this tacky film 220, the same films or sheets as used in the release substrate 212 may be used.

Examples thereof may include polyester films such as polyethylene terephthalate film; polyolefin films such as polytetrafluoroethylene film, polyethylene film, polypropylene film, polymethylpentene film, and polyvinyl acetate film; plastic films such as polyvinyl chloride film and polyimide film, and the like. Further, laminates comprising two layers or more composed of these films may be used as the substrate film 224.

The thickness of the substrate film 224 is preferably from 10 to 500 μm, more preferably from 25 to 100 μm, particularly preferably from 30 to 50 μm.

It is preferable that the tacky layer 222 constituting the tacky film 220 is cured by high energy beams such as ultraviolet ray or radial rays, or heat (to lower the tack strength), more preferably it is cured by high energy beams, particularly preferably it is cured by ultraviolet ray.

As The tack agent constituting such a tacky layer 222, various types have hitherto been known. It is preferable that a suitable tack agent by which the tack strength to the adhesive layer 214 is lowered by irradiation of high energy beams is selected from among the various types.

Examples of the above-mentioned tack agent may includes, for example, compounds having diol group, isocyanate compounds, urethane (meth)acrylate compounds, diamine compounds, urea methacrylate compounds, high energy beams polymerizable copolymer having an ethylenically unsaturated group at the side chains, and the like. They may be used alone or in combination thereof.

The thickness of the tacky layer 222 is preferably from 1 to 100 μm, more preferably 2 to 20 μm, particularly preferably from 3 to 10 μm. When the thickness is less than 1 μm, it tends to become difficult to be secure a sufficient tack strength, and semiconductor chips can be scattered while dicing. When the thickness is more than 100 μm, the thickness of the adhesive sheet 201 is too thick as a whole, and therefore, it tends to become difficult to stick it to an adherend.

The adhesive sheet 201 has the release substrate 212, the adhesive layer 214, the tacky layer 22 and the substrate film 224, as mentioned above. In the release substrate 212 of the adhesive sheet 1, the first incision D1 is formed along a periphery of a plane shape of the laminate 210 comprising the adhesive layer 214, the tacky layer 22 and the substrate film 224 from a surface bringing contact with the adhesive layer 214 on the release substrate 212 in a thickness direction of the release substrate 212.

The incision depth d1 of the first incision D1 is less than the thickness of the release substrate 212 and 25 μm or less. Here, in order to obtain better releasability, the incision depth d1 is more preferably 15 μm or less, still further preferably 10 μm or less, particularly preferably 5 μm or less. As mentioned above, the closer to 0 μm the incision depth d1, the better the releasability, and it is the most preferable that it is more than 0 μm and 0.5 μm or less.

When the incision depth d1 of the first incision D1 is within the above-mentioned range, the adhesive layer 214 and the tacky layer 222 in the adhesive sheet 201 can be sufficiently inhibited from biting to the first incision D1. As a result, the interface between the release substrate 212 and the adhesive layer 214 is not sealed, the laminate 210 is easily peeled off from the release substrate 212, whereby the peel defect can be sufficiently inhibited when the laminate 210 is stuck to the adherend.

However, if the incision depth is brought close to 0 μm by using a current precut apparatus, it takes a long time for adjusting the apparatus and performing the precut processing, and, consequently, the production efficiency tends to lower. Accordingly, the incision depth d is preferably from 5 to 15 μm, form the viewpoint of the balance of the production efficiency and the inhibition of peel defect.

Also, in the adhesive sheet 201, it is preferable that a value of (d1/a) satisfies a condition showing the following formula (2):

$$0 < (d1/a) \leq 0.7 \qquad (2)$$

wherein a (μm) is a thickness of the release substrate 212.

When the value of the above-mentioned (d1/a) satisfies the condition showing the above-mentioned formula (2), the adhesive layer 214 and the tacky layer 222 can be more sufficiently inhibited from biting to the first incision D1, and peel defect can be more sufficiently inhibited. In order to fully obtain such an effect, the upper limit of the value of (d1/a) in the above-mentioned formula (2) is more preferably 0.5, still further preferably 0.3, particularly preferably 0.25, extremely preferably 0.15, the most preferably 0.1.

As mentioned above, the above-mentioned incision depth d1 refers to a value obtained by measuring a depth of an incision D1 formed in the release substrate 212 is measured with a cross-section observation using an electron microscope at 10 points arbitrarily selected, and averaging the obtained 10 values are averaged. It is preferable that all of the depths of 10 incisions D1 arbitrarily selected and measured are within the above-mentioned range, from the viewpoint of the more sufficient inhibition of the peel defect. The same holds for the incision depth d2 of the below-mentioned second incision D2.

Eighth Embodiment

Figure 18:
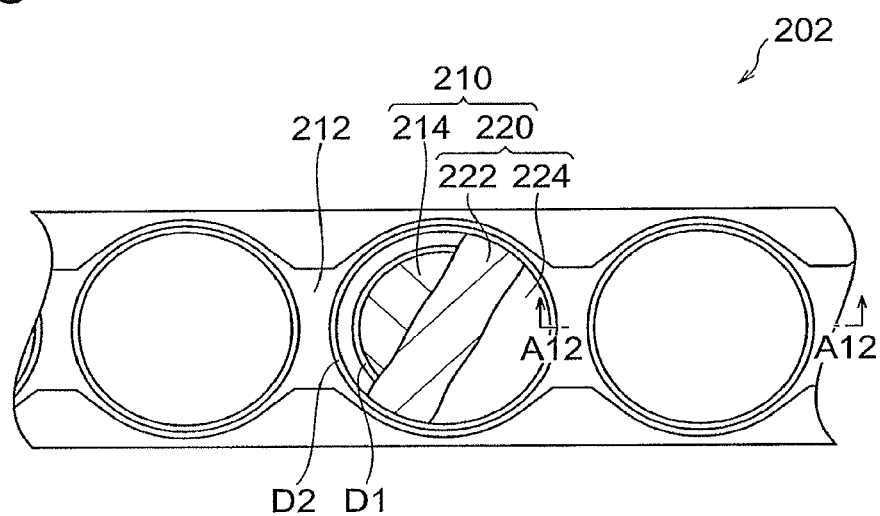
FIG. 18 is a plane view showing an eighth embodiment of an adhesive sheet of the present invention.
Figure 19:
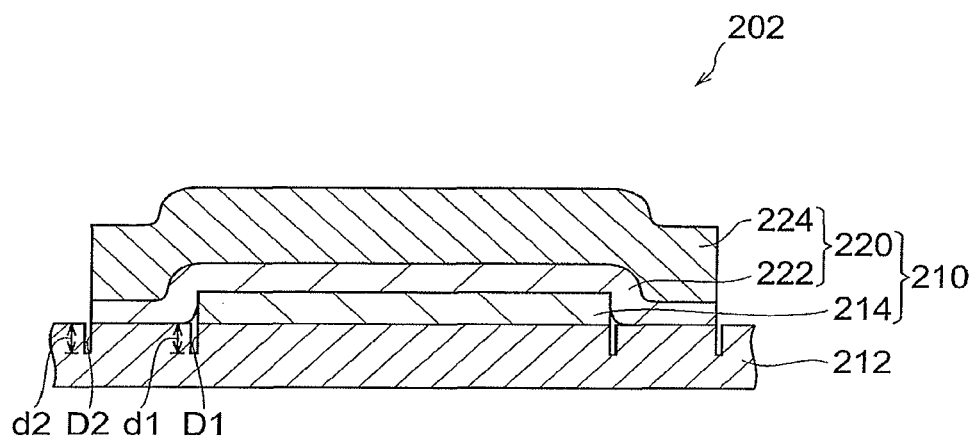
FIG. 19 is a schematic cross-section view of the adhesive sheet 202 shown in FIG. 18 which is cut along the line A12-A12 in FIG. 18.

FIG. 18 is a plane view showing an eighth embodiment of an adhesive sheet of the present invention, and FIG. 19 is a schematic cross-section view of the adhesive sheet 202 shown in FIG. 18 which is cut along the line A12-A12 in FIG. 18. As shown in FIG. 18 and FIG. 19, an adhesive sheet 202 has a structure in which a release substrate 212, an adhesive layer 214, a tacky layer 222, and a substrate film 224 are laminated in order. The adhesive layer 214 is cut in a pre-determined first plane shape, and is partly laminated on the release substrate 212. In the release substrate 212, the first incision D1 is formed along the first plane shape of the adhesive layer 214 from a surface bringing contact with the adhesive layer 214 in the thickness direction of the release substrate 212. The tacky layer 222 covers the adhesive layer 214, and laminated around the adhesive layer 214 so as to bring contact with the release substrate 212. A tacky film 220 comprising the tacky layer 222 and the substrate film 224 is cut in a pre-determined second plane shape. In the release substrate 212, a second incision D2 is formed along a periphery of a second plane shape of the tacky film 220 from a surface bringing contact with the tacky layer 222 in a thickness direction of the release substrate 212.

In the adhesive sheet 202, the incision depth d1 of the first incision D1 and incision depth d2 of the second incision D2, which incisions are formed in the release substrate 212, are less than the thickness of the release substrate 212 and 25 μm or less.

Here, in order to obtain better releasability, the incision depth d1 of the first incision D1 and the incision depth d2 of the second incision D2 are more preferably 15 μm or less, still further preferably 10 μm or less, particularly preferably 5 μm or less. As mentioned above, the closer to 0 μm the incision depth d1, the better the releasability, and it is the most preferable that the depths are more than 0 μm and 0.5 μm or less. From the viewpoint of the balance between the efficiency and the inhibition of peel defect, the incision depths d1 and d2 are preferably from 5 to 15 μm.

Also, in the adhesive sheet 202, it is preferable that a value of (d1/a) satisfies a condition showing the following formula (2):

$$0 < (d1/a) \leq 0.7 \quad (2)$$

wherein a (μm) is a thickness of the release substrate 212.

Further, it is preferable that a value of (d2/a) satisfies a condition showing the following formula (3):

$$0 < (d2/a) \leq 0.7 \quad (3)$$

wherein a (μm) is a thickness of the release substrate 212.

When the value of the above-mentioned (d1/a) satisfies the condition showing the above-mentioned formula (2), the adhesive layer 214 and the tacky layer 222 can be more sufficiently inhibited from biting to the first incision D1, and peel defect can be more sufficiently inhibited. When the value of the above-mentioned (d2/a) satisfies the condition showing the above-mentioned formula (3), the tacky layer 222 can be more sufficiently inhibited from biting to the second incision D2, and peel defect can be more sufficiently inhibited. In order to fully obtain such effects, the upper limits of the value of (d1/a) in the above-mentioned formula (2) and the values of (d2/a) in the above-mentioned formula (3) are more preferably 0.5, still further preferably 0.3, particularly preferably 0.25, extremely preferably 0.15, the most preferably 0.1.

In the adhesive sheet 202, the same materials as in the adhesive sheet 201 concerning the above-mentioned seventh embodiment may be used as the release substrate 212, the adhesive layer 214, the tacky layer 222 and the substrate film 224.

When wafer ring is used in the dicing operation of the semiconductor wafer is subjected to dicing, the adhesive sheet 202 having such a structure makes the tacky layer 222 closely contact to the wafer ring, whereby the dicing can be easily operated.

When the incision depth d1 of the first incision D1 and the incision depth d2 of the second incision D2 in the release substrate 212 of the adhesive sheet 202 are within the above-mentioned range, the adhesive layer 214 can be sufficiently inhibited from biting to the first incision D1, and the tacky layer 222 can also be inhibited from biting to the second incision D2. As a result, the interface between the release substrate 212 and the adhesive layer 214, and the interface between the release substrate 212 and the tacky layer 222 are not sealed, and the laminate 210 can be easily peeled off from the release substrate 212, and the peel defect can be sufficiently inhibited when the laminate 210 is stuck to the adherend.

Ninth Embodiment

Figure 20:
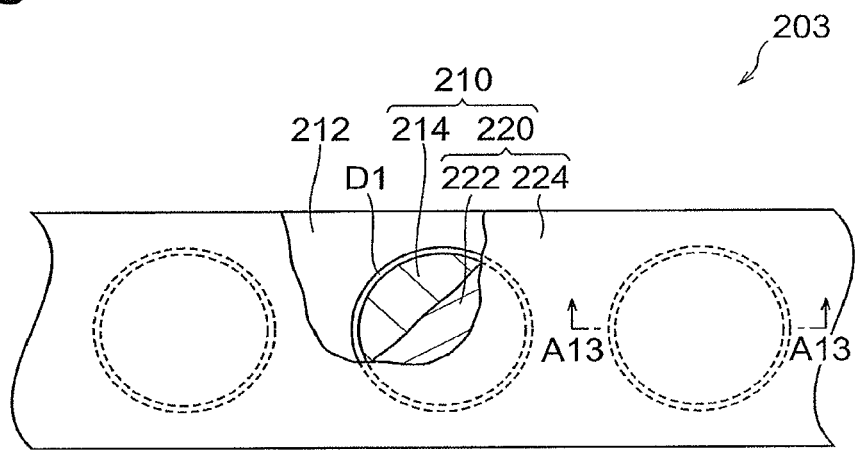
FIG. 20 is a plane view showing a ninth embodiment of an adhesive sheet of the present invention.
Figure 21:
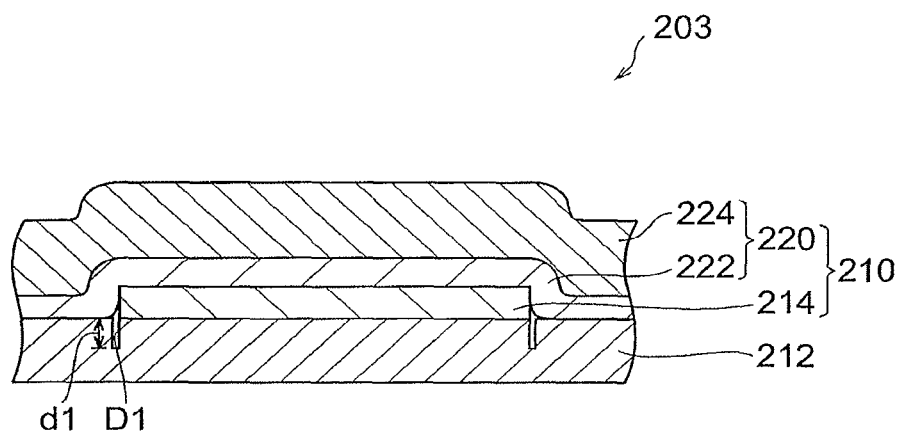
FIG. 21 is schematic cross-section view of the adhesive sheet 203 shown in FIG. 20 which is cut along the line A13-A13 in FIG. 20.

FIG. 20 is a plane view showing a ninth embodiment of an adhesive sheet of the present invention, and FIG. 21 is schematic cross-section view of the adhesive sheet 203 shown in FIG. 20 which is cut along the line A13-A13 in FIG. 20. As shown in FIG. 20 and FIG. 21, an adhesive sheet 203 has a structure in which a release substrate 212, an adhesive layer 214, a tacky layer 222 and a substrate film 224 are laminated in order. The adhesive layer 214 is cut in a pre-determined plane shape, and is partly laminated on the release substrate 212. In the release substrate 212, a first incision D1 is formed on a periphery of a plane shape of the adhesive layer 214 from a surface bringing contact with the adhesive layer 214 in a thickness direction of the release substrate 212. Also, the tacky layer 222 and the substrate film 224 cover the adhesive layer 214, and they are laminated so that the tacky layer 222 is brought contact with the release substrate 212 around the adhesive layer 214.

In such a adhesive sheet 203, a thickness of an incision depth d1 of a first incision D1 formed on the release substrate 212 is less than the thickness of the release substrate 212 and 25 μm or less.

Here, in order to obtain better releasability, the incision depth d1 of the first incision D1 is more preferably 15 μm or less, still further preferably 10 μm or less, particularly preferably 5 μm or less. As mentioned above, the closer to 0 μm the incision depth d1, the better the releasability, and it is the most preferable that the depth is more than 0 μm and 0.5 μm or less. The incident depth d1 is preferably from 5 μm to 15 μm from the viewpoint of the production efficiency and the inhibition of peel defect.

Also, in the adhesive sheet 203, it is preferable that a value of (d1/a) satisfies a condition showing the following formula (2):

$$0 < (d1/a) \leq 0.7 \quad (2).$$

When the value of the above-mentioned (d1/a) satisfies the condition showing the above-mentioned formula (2), the adhesive layer 214 and the tacky layer 222 can be more sufficiently inhibited from biting to the first incision D1, and peel defect can be more sufficiently inhibited. In order to fully obtain such an effect, the upper limits of the value of (d1/a) in the above-mentioned formula (2) is more preferably 0.5, still further preferably 0.3, particularly preferably 0.25, extremely preferably 0.15, the most preferably 0.1.

In the adhesive sheet 203, the same materials as in the adhesive sheet 201 concerning the above-mentioned seventh embodiment may be used as the release substrate 212, the adhesive layer 214, the tacky layer 222 and the substrate film 224.

When the incision depth d1 of the first incision D1 in the release substrate 212 of the adhesive sheet 203 is within the above-mentioned range, the adhesive layer 214 can be sufficiently inhibited from biting to the first incision D1. As a result, the interface between the release substrate 212 and the adhesive layer 214 is not sealed, and the laminate 210 can be easily peeled off from the release substrate 212, and the peel defect can be sufficiently inhibited when the laminate 210 is stuck to the adherend.

Production Method of Adhesive Sheet

Tenth Embodiment

A method for producing the adhesive sheet 201 concerning the above-mentioned seventh embodiment, in accordance with the tenth embodiment will be described.

The adhesive sheet 201 is produced by a method comprising a first laminating step in which the adhesive layer 214, the tacky layer 222 and the substrate film 224 are laminated on the release substrate 212; and a first cutting step in which an incision is made from an opposite surface to a side bringing contact with the tacky layer 222 of the substrate film 224, until the incision reaches to the release substrate 212, whereby the adhesive layer 214, the tacky layer 222 and the substrate film 224 are cut in pre-determined plane shapes, as well as the first incision D1 is formed in the release substrate 212.

Here, in the first cutting step, the incision is made so that the incision depth d1 of the first incision D1 is less than the thickness of the release substrate 212 and is 25 μm or less.

Now, each production step will be described in detail.

In the first laminating step, first, materials constituting the adhesive layer 214 are dissolved or dispersed in a solvent to give a vanish for forming the adhesive layer, and the vanish is coated on the release substrate 212, and after that, the solvent is removed by heating to form the adhesive layer 214. Similarly, materials constituting the tacky layer 222 are dissolved or dispersed in a solvent to give a vanish for forming the tacky layer, and the vanish is coated on the substrate film 224, and after that, the solvent is removed by heating to form the tacky film 220.

Here, the above-mentioned solvents used in the production of vanish are not particularly limited, so long as they can solve or disperse various constituting materials. In view of the volatility upon formation of layers, it is preferable to use solvents having a relatively low boiling point such as methanol, ethanol, 2-methoxyethanol, 2-ethoxyethanol, 2-butoxyethanol, methyl ethyl ketone, acetone, methyl isobutyl ketone, toluene, and xylene. In order to improve the coating property, solvents having a relatively high boiling point such as dimethyl acetoamide, dimethylformamide, N-methylpyrrolidone, and cyclohexanone can be used. These solvents may be used alone or in combination thereof. It is also possible to remove bubbles from the vanish by vacuum exhausting after producing the vanish.

For coating the vanish on the release substrate 212 and substrate film 224, known method may be used, and for example, a knife coating method, a roll coating method, a spray coating method, a gravure coating method, a bar coating method, a curtain coating method, and the like may be used.

Next, as mentioned above, the film in which the adhesive layer 214 is formed on the release substrate 212 (hereinafter referred to as "adhesive film") and the tacky layer 222 is formed on the substrate film 224 (hereinafter referred to as "tacky film 220") are laminated, whereby the adhesive sheet before precut (hereinafter referred to as a "precursor sheet" is formed to complete the first laminating step.

Here, the lamination of the adhesive film and the tacky film 220 may be performed in a conventional known manner such as a method in which a laminator is used.

Also, the precursor sheet can be produced by the following method. That is, a method in which after the vanish for forming the adhesive layer is coated on the release substrate 212, the solvent is removed by heating to form the adhesive layer 214, on which the vanish for forming the tacky layer is coated, and then the solvent is removed by heating to form the tacky layer 222; a method in which after the vanish for forming the tacky layer is coated on the substrate film 224, the solvent is removed by heating to form the tacky layer 222, on which the vanish for forming the tacky layer is coated, and then the solvent is removed by heating to form the adhesive layer 214 may be employed.

In the first cutting step, the incision is made in the precursor sheet produced as above from an opposite surface to the side bringing contact with the tacky layer 222 of the substrate film 224 until the incision reaches the release substrate 212, whereby the laminate 210 comprising the adhesive layer 12, the tacky layer 222, and the substrate film 224 in a pre-determined plane shape and the incision D1 is formed in the release substrate 212.

Here, the cutting of the laminate 210 can be performed using a precutting blade C having a shape corresponding to the pre-determined plane shape.

In the first cutting step, the incision is made so that the incision depth d1 of the incision D1 is less than the thickness of the release substrate 212 and 25 μm or less. In order to obtain the adhesive sheet 201 having better releasability, it is more preferable that the incision depth d1 of the incision D1 is 15 μm or less, still further preferably 10 μm or less, particularly preferably 5 μm or less. As mentioned above, the closer to 0 μm the incision depth d1, the better the releasability, and the depth of more than 0 μm and 0.5 μm or less is the most preferable. However, form the viewpoint of the balance of the production efficiency and the inhibition of peel defect, the incision depth d1 is preferably from 5 to 15 μm.

Also, in the first cutting step, it is preferable that a value of (d1/a) satisfies a condition showing the following formula (2):

$$0<(d1/a)\leq 0.7 \qquad (2)$$

wherein a (μm) is a thickness of the release substrate 212.

This gives that the adhesive sheet 201 capable of sufficiently inhibiting the peel defect can be obtained. In order to fully obtain such an effect, the upper limit of the value of (d1/a) in the above-mentioned formula (2) is more preferably 0.5, still further preferably 0.3, particularly preferably 0.25, extremely preferably 0.15, the most preferably 0.1.

After that, if necessary, an unnecessary part is peeled off and removed from the laminate 210 to obtain the adhesive sheet 201.

Eleventh Embodiment

A method for producing the adhesive sheet 202 concerning the above-mentioned eighth embodiment in accordance with the eleventh embodiment will be described.

An adhesive sheet 202 is produced by a production method comprising a second laminating step in which an adhesive layer 214 is laminated on a release substrate 212; a second cutting step in which an incision is made from an opposite surface to a side bringing contact with the release substrate 212 of the adhesive layer 214, whereby the adhesive layer 214 is cut in a pre-determined first plane shape and the first incision D1 is formed in the release substrate 212; a third laminating step in which a tacky layer 222 and a substrate film 224 are laminated in order so that, on the adhesive layer 214, the tacky layer 222 covers the adhesive layer 214 and adheres to the release substrate 212 around the adhesive layer 214; and a third cutting step in which an incision is made from an opposite surface to the side bringing contact with the tacky layer 222 of the substrate film 224, whereby the substrate film 224 and the tacky layer 222 are cut in pre-determined second plane shapes and the second incision D2 is formed in the release substrate 212.

Here, in the second cutting step, the incision is made so that the incision depth d1 of the first incision D1 is less than the thickness of the release substrate 212 and 25 μm or less. In the third cutting step, the incision is made so that the incision depth d2 of the second incision D2 is less than the thickness of the release substrate 212 and 25 μm or less.

Now, each production step will be described in detail.

In the second laminating step, materials constituting the adhesive layer 214 are dissolved or dispersed in a solvent to give a vanish for forming the adhesive layer, and the vanish is coated on the release substrate 212, and after that, the solvent is removed by heating to form the adhesive layer 214. By this operation, the adhesive sheet is formed and the second laminating step is completed.

In the second cutting step, the incision is made in the adhesive film produced as above from the opposite surface to the side bringing contact with the release substrate 212 of the adhesive layer 214 until the incision reaches the release substrate 212, whereby the adhesive layer 214 is cut in a pre-determined first plane shape and the first incision D1 is formed in the release substrate 212.

Here, the cutting of the laminate 214 can be performed using a precutting blade C having a shape corresponding to the pre-determined plane shape.

In the second cutting step, the incision is made so that the incision depth d1 of the incision D1 is less than the thickness of the release substrate 212 and 25 μm or less. In order to obtain the adhesive sheet 202 having better releasability, it is more preferable that the incision depth d1 of the incision D1 is 15 μm or less, still further preferably 10 μm or less, particularly preferably 5 μm or less. As mentioned above, the closer to 0 μm the incision depth d1, the better the releasability, and the depth of more than 0 μm and 0.5 μm or less is the most preferable. However, form the viewpoint of the balance of the production efficiency and the inhibition of peel defect, the incision depth d1 is preferably from 5 to 15 μm.

Also, in the second cutting step, it is preferable that a value of (d1/a) satisfies a condition showing the following formula (2):

$$0<(d1/a)\leq 0.7 \tag{2}$$

wherein a (μm) is a thickness of the release substrate 212.

This gives that the adhesive sheet 202 capable of sufficiently inhibiting the peel defect can be obtained. In order to fully obtain such an effect, the upper limit of the value of (d1/a) in the above-mentioned formula (2) is more preferably 0.5, still further preferably 0.3, particularly preferably 0.25, extremely preferably 0.15, the most preferably 0.1.

After that, if necessary, an unnecessary part is peeled off and removed from the adhesive layer 214 to obtain the adhesive film.

In the third laminating step, the tacky layer 222 and the substrate film 224 are laminated in order on the adhesive layer 214 which has been subjected to the precut processing in the above-mentioned the second cutting step so that the tacky layer 222 covers the adhesive layer and is brought contact with the release substrate 212 around the adhesive layer 214 to produce the precursor sheet.

For laminating, for example, a method in which the tacky film 220 comprising the tacky layer 222 is stuck to the substrate film 224 using a laminator, or the like, a method in which a vanish for forming a tacky layer is coated on the adhesive layer 214, the solvent is removed by heating to form the tacky layer 222, on which the substrate film 224 is stuck, and the like may be employed.

In the third cutting step, the incision is made on the precursor sheet produced above from the opposite surface to the side bringing contact with the tacky layer 222 of the substrate film 224 until the incision reach the release substrate 212, whereby the tacky film 220 comprising the substrate film 224 and the tacky layer 222 is cut in the pre-determined second plane shape and the second incision D2 is formed in the release substrate 212.

Here, the cutting of the tacky film 220 can be performed using a precutting blade C having a shape corresponding to the pre-determined plane shape.

In the third cutting step, the incision is made so that the incision depth d2 of the incision D2 is less than the thickness of the release substrate 212 and 25 μm or less. In order to obtain the adhesive sheet 202 having better releasability, it is more preferable that the incision depth d2 of the incision D2 is 15 μm or less, still further preferably 10 μm or less, particularly preferably 5 μm or less. As mentioned above, the closer to 0 μm the incision depth d1, the better the releasability, and the depth of more than 0 μm and 0.5 μm or less is the most preferable. However, form the viewpoint of the balance of the production efficiency and the inhibition of peel defect, the incision depth d2 is preferably from 5 to 15 μm.

Also, in the third cutting step, it is preferable that a value of (d2/a) satisfies a condition showing the following formula (3):

$$0<(d2/a)\leq 0.7 \tag{3}$$

wherein a (μm) is a thickness of the release substrate 212.

This gives that the adhesive sheet 202 capable of sufficiently inhibiting the peel defect can be obtained. In order to fully obtain such an effect, the upper limit of the value of (d2/a) in the above-mentioned formula (3) is more preferably 0.5, still further preferably 0.3, particularly preferably 0.25, extremely preferably 0.15, the most preferably 0.1.

After that, if necessary, an unnecessary part is peeled off and removed from the adhesive layer 214 from the tacky film 220 to obtain the adhesive film 202.

Although the preferable embodiments of the adhesive sheet of the present invention and the method for producing the adhesive sheet were described in detail as above, the present invention is not limited to these embodiments. For example, the adhesive sheet 202 having the structure shown in FIG. 18 and FIG. 19 wherein the second incision D2 is not formed on the release substrate 212 may be used. The adhesive sheet having such a structure can be produced, for example, by laminating the adhesive layer 214 on the release substrate 212, subjecting the adhesive layer 214 to the precut processing, and sticking the tacky film 220 which has previously been cut in a pre-determined plane shape so that the tacky layer 222 covers the adhesive layer 214 and is brought contact with the release substrate 212 around the adhesive layer 214.

In the method for producing the adhesive sheet 202 concerning the eleventh embodiment, the third cutting step may not be performed. In this case, the adhesive sheet 203 in which the tacky film 220 is not subjected to the precut processing, that is, having the structure shown in FIG. 20 and FIG. 21 can be obtained.

[Production Method of Semiconductor Device]

A method for producing a semiconductor device using the adhesive sheet described above will be described using FIG. 22. In the following description, a case in which as an adhesive sheet, the adhesive sheet 202 in the above-mentioned eighth embodiment is used will be described.

Figure 22:
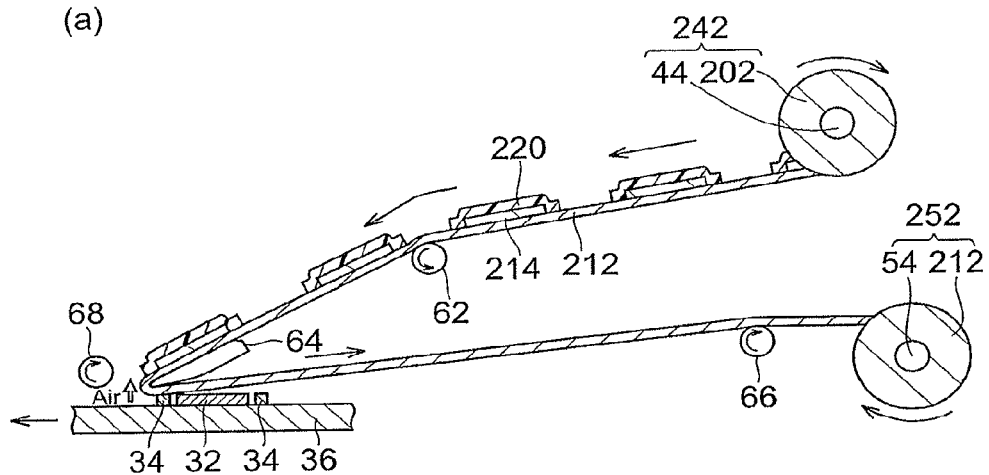
FIG. 22 is a process chart showing series of steps for sticking a laminate 210 to a semiconductor wafer 32.
Figure 22:
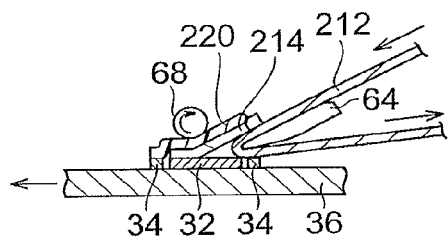
Figure 22:
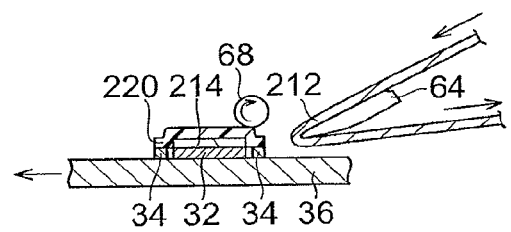

FIG. 22 is a process chart showing series of steps for sticking a laminate 210 of an adhesive sheet 202 to a semiconductor wafer 32. As shown in FIG. 22 (a), in the adhesive sheet 202, the release substrate 212 serves as a carry film, and it is supported by two rolls 62 and 66, and a cuneate member 64. The adhesive sheet 202 is wound in a state in which its one end is attached to a cylindrical core 44 to form a first roll 242, and its other end is attached to a cylindrical core 54 to form a second roll 252. To the core 54 of the second roll 252 is attached a core driving motor for rotating the core 54 (not shown in Fig.). This gives that after the laminate 210 is peeled off, the resulting release substrate 210 is wound around the core 54 at a pre-determined speed.

First, when the core driving motor is rotated, the core 54 of the second roll 252 is rotated, whereby the adhesive sheet 202 wound around the core 44 of the first roll 242 is drawn outward from the first roll 242. The drawn adhesive sheet 202 is introduced on the disc-shaped semiconductor wafer 32 placed on the mobile stage 36, and the wafer ring 34 placed so as to surround the semiconductor wafer 32.

Next, the laminate 210 comprising the adhesive layer 214 and the tacky film 220 is peeled off from the release substrate 212. At this time, the cuneate member 64 is brought contact with the release substrate 212 from the release substrate 212 side of the adhesive sheet 202, whereby the release substrate 212 is bent to the member 64 side at a sharp angle. As a result, base points for peeling are formed between the release substrate 212 and the laminate 210. Further, in order to more efficiently form the base points for peeling, air is blown at a boundary surface between the release substrate 212 and the laminate 210.

After the base points for peeling are formed between the release substrate 212 and the laminate 210, as mentioned above, to which the laminate 210 is stuck so that the tacky film 220 closely contacts the wafer ring 34 and the adhesive layer 214 closely contacts the semiconductor wafer 32, as shown in FIG. 22 (b). At this time, the laminate 210 is joined with pressure to the semiconductor wafer 32 by roll 68. After that, as shown in FIG. 22 (c), the lamination of the laminate 210 on the semiconductor wafer 32 is completed to obtain the semiconductor wafer having the laminate.

According to the above-mentioned procedure, the lamination of the laminate 210 to the semiconductor wafer 32 can be continuously performed in an automatic step. Examples of the apparatus for laminating the laminate 210 to the semiconductor wafer 32, used in the above-mentioned procedure, may include, for example, RAD-2500™ manufactured by Lintec Corporation, and the like.

When the laminate 210 is stuck to the semiconductor wafer 32 according to this step, the base points for peeling between the release substrate 212 and the laminate 210 (the bases points for peeling between the release substrate 212 and the tacky layer 222) can be easily formed by using the adhesive sheet 202, and therefore the occurrence of the peel defect can be fully inhibited.

Next, the semiconductor wafer having the laminate obtained in the above-mentioned step is diced to give a semiconductor element with the laminate having a necessary size. Further, in this process, steps for drying or washing or the like may be performed. At this time, since the semiconductor wafer 32 is sufficiently stuck and held to the laminate 210 through the adhesive layer 214 and the tacky layer 222, falling of the semiconductor wafer is sufficiently inhibited during the above-mentioned steps.

Next, high energy beams such as radial rays are irradiated to the tacky layer 222 of the laminate 210 to cure a part or a large part of the tacky layer 222 with polymerization. In this case, in order to accelerate the curing reaction, the layer may be heated at the same time of after the irradiation of the high energy beams.

The high energy beams are irradiated to the tacky layer 222 from a surface where the tacky layer 222 of the substrate film 224 is not formed. It is necessary that the substrate film 224 is light-transmissive, when ultraviolet ray is used as the high energy beams, accordingly. When electron beam is used as the high energy beams, the substrate film 224 is not necessary light-transmissive.

After the irradiation of the high energy beams, the semiconductor element to be picked-up is picked-up with, for example, a suction collet. At this time, the semiconductor element to be picked-up can be knocked up with, for example, a needle rod from the under surface of the substrate film 224. By curing the tacky layer 222, the tack strength between the semiconductor element and the adhesive layer 214 is greater than that between the adhesive layer 214 and the tacky layer 222, and therefore, when the semiconductor element is picked-up, the peeling occurs at an interface between the adhesive layer 214 and the tacky layer 222, and the semiconductor element having the adhesive layer in which the adhesive layer 214 adheres to the under surface of the semiconductor element is picked-up.

This semiconductor element having the adhesive layer is mounted on a support member for mounting a semiconductor element through the adhesive layer 214, which is heated. The adhesive strength of the adhesive layer 214 is expressed by heating, and the adhesion between the semiconductor element and the support member for mounting a semiconductor element is completed.

After that, if necessary, a wire stick step and a sealing step are performed to produce a semiconductor device.

[Semiconductor Device]

Figure 23:
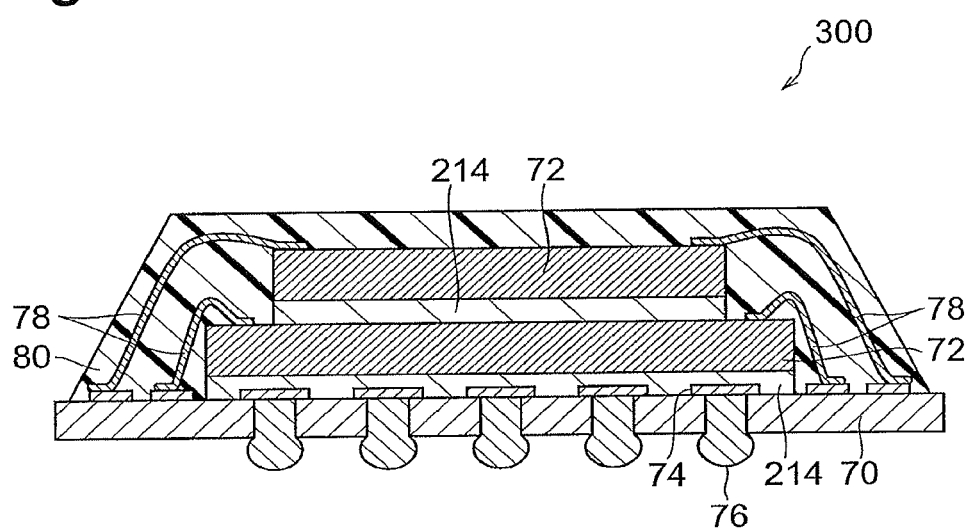
FIG. 23 is a schematic cross-section view showing one embodiment of a semiconductor element of the present invention.
Figure 24:
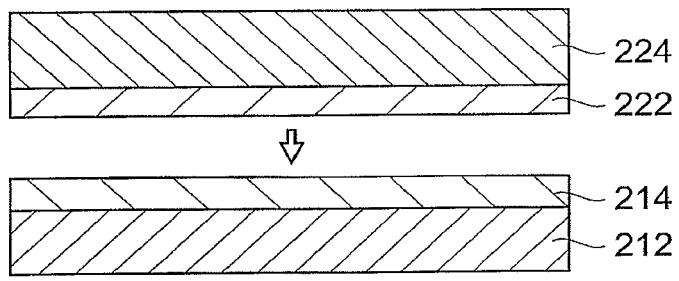
FIG. 24 is a process chart showing series of steps for performing a precut processing to a laminated adhesive sheet.
Figure 24:
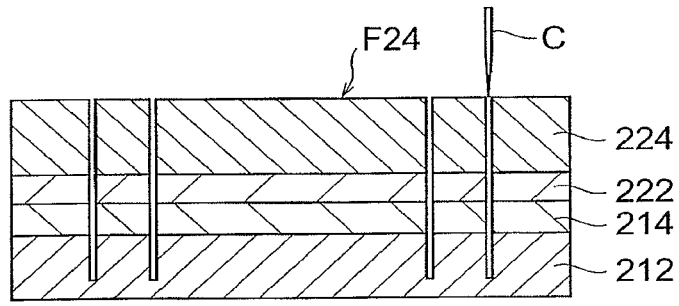
Figure 24:
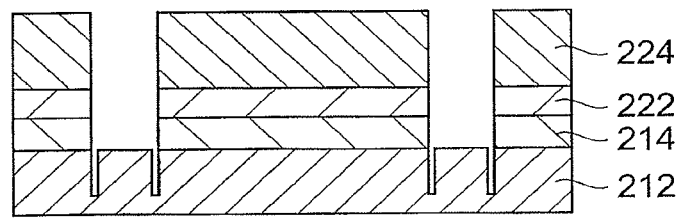
Figure 25:
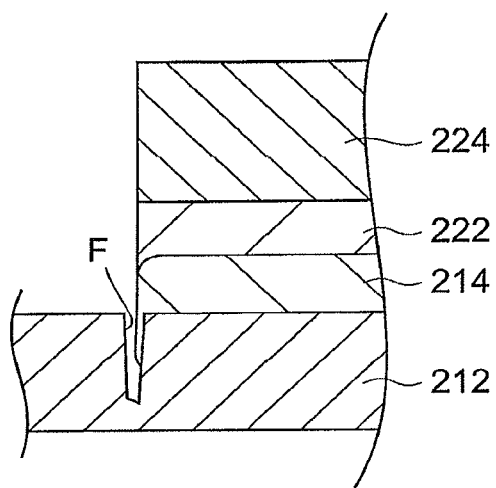
FIG. 25 is an enlarged schematic cross-section view of the vicinity of an incision F formed on a release substrate 212 according to the conventional precut processing.

FIG. 23 is a schematic cross-section view showing one embodiment of a semiconductor element of the present invention, mentioned above.

As shown in FIG. 23, in the semiconductor device 300, two layers of the semiconductor element having the adhesive layer comprising the adhesive layer 214 and the semiconductor element 72 are laminated on the organic substrate 70, which is the support member for mounting a semiconductor element. Also, the circuit pattern 74 and the terminal 76 are formed on the organic substrate 70, and this circuit pattern 74 is attached to the two semiconductor elements 72 are through the wire stick 78, which is sealed with the sealer 80 to form the semiconductor device 300. This semiconductor device 300 is produced using the adhesive sheet 202 in accordance with the method for producing a semiconductor device of the above-mentioned present invention.

Although the preferable embodiments of the method for producing the semiconductor device of the present invention and the semiconductor device were described in detail as above, the present invention is not limited to these embodiments. For example, though the embodiment in which the adhesive sheet 202 is used in the method for producing a semiconductor device was described above, the adhesive sheet 201 or the adhesive sheet 203 may be used as the adhesive sheet. In case where the adhesive sheet 203 is used, after the laminate 210 in the adhesive sheet 203 is stuck to the semiconductor wafer 32 and the wafer ring 34, the tacky film 220 in the laminate 210 is cut matching the diameter of the wafer ring 34. Examples of the apparatus for performing the operation may include, for example, PM-8500™ manufactured by Nito Seiki Manufacturing Corporation, and the like.

EXAMPLE

Now, the present invention will be described more specifically by means of Examples and Comparative Examples, but the present invention is not limited to the following Examples.

Synthesis Example 1

Synthesis of Acrylic Polymer

In a 500 ml four-necked separable flask equipped with a stirrer, a dropping funnel, a thermometer, and a condenser was put 126.0 g of 2-butanone, and the temperature of the flask was elevated to 80° C. while nitrogen gas was blown thereto at a flow rate of 100 ml/min, which was kept at that temperature for about 30 minutes. After that, while the temperature was kept at 80° C., a solution in which 0.6 g of 2,2-azobis(isobutyronitrile) was dissolved in a mixed liquid of 14.8 g of 2-butanone, 15.0 g of methacrylic acid, 15.0 g of methyl methacrylate and 70.0 g of 2-ethylhexyl acrylate was added dropwise to the 2-butanone over 4 hours, and the mixture was kept at that time for 2 hours. After that, a solution in which 0.06 g of 2,2-azobis(isobutyronitrile) was dissolved in 8.5 g of 2-butanone was added dropwise to the mixture over 30 minutes, which was kept at that temperature for 5.5 hours to give an acrylic polymer having a weight average molecular weight of 60,000 (a value obtained by measuring with a gel permeation chromatography, and converting with a standard polystyrene analytical curve) and a non-volatile component of 40% by mass.

Preparation Example 1

Production of Tacky Film

To a composition including 100 parts by mass of the acrylic polymer synthesized in Preparation Example 1, NK-ESTER BPE-200 (TM, manufactured by Shin-Nakamura Chemical Co., Ltd), 22.05 parts by mass of 2,2-bis(4-methacryloxyethoxyphenyl)propane, and 0.5 part by mass of 1-hydroxycyclohexyl phenyl ketone was added 100 parts by mass of methyl ethyl ketone, which was stirred and degassed under vacuum to prepare a vanish for forming a tacky layer. This vanish for forming a tacky layer was coated on a 75 μm-thick polyethylene terephthalate (PET) film (manufactured by Teijin DuPont Film Limited, Teijin Purex S31), which was treated with a release agent, which was dried by heating at 100° C. for 5 minutes to form a tacky layer having a thickness of 10 μm. Thus, the pressure-sensitive adhesive film comprising the PET film and the tacky layer was obtained.

Example 1

First, to 60 parts by mass of YDCN-703 (TM, manufactured by Tohto Kasei Co., Ltd., cresol novolac type epoxy resin having an epoxy equivalent weight of 220) as an epoxy resin, and 40 parts by mass of XLC-LL (TM, manufactured by Mitsui Chemicals, Inc., phenol xylene glycol-dimethyl ether condensate) as a curing agent was added 1500 parts by mass of cyclohexanone, and the mixture was stirred to prepare a first vanish. Then, to the first vanish were added 1 part by mass of NUC A-189 (TM, manufactured by Nippon Unicar Company Limited, γ-glycidoxypropyltrimethoxysilane) and 1 part by mass of NCU A-1160 (TM, manufactured by Nippon Unicar Company Limited, γ-ureidopropyltriethoxysilane) as coupling agents, to which R972V (TM, manufactured by Nihon Aerosil, a silica filler) was added in an amount of 10% by volume of the whole volume of the composition, and the mixture was stirred, followed by dispersing treatment in a bead mill to prepare a second vanish. To the second vanish were added 250 parts by mass of HTR-860-P3 (TM, manufactured by Nagase Chemtex Corporation, an epoxy group-containing acrylic copolymer) and 0.5 part by mass of Curezole 2PZ-CN (TM, manufactured by Shikoku Chemicals Corporation, 1-cyanoethyl-2-phenylimidazole) as a curing accelerator, and the mixture was stirred to prepare a vanish for forming an adhesive layer.

This vanish for forming an adhesive layer was coated on a 38 μm-thick polyethylene terephthalate (PET) film (manufactured by Teijin DuPont Film Limited, Teijin Purex A31), which was treated with a release agent, which was dried at 140° C. for 5 minutes to form a 10 μm-thick adhesive layer in B stage. Thus, the adhesive film comprising the PET film (the release substrate) and the adhesive layer was obtained.

The obtained adhesive film was subjected to a circle precut processing (a first precut processing) to form an incision having an incision depth of 10 μm and φ210 mm in the release substrate.

After that, unnecessary parts were removed from the adhesive layer, the tacky layer of the tacky film was stuck to the adhesive layer at room temperature under conditions of a line pressure of 1 kg/cm and a rate of 0.5 m/minute. The tacky film was subjected to a circle precut processing (a second precut processing) concentrically of the adhesive layer so that an incision depth in the release substrate is 10 μm or less and φ290 mm to produce an adhesive sheet of Example 1.

When ten incision depths, which were arbitrarily selected, in the release substrate in the first precut processing were measured, all of them were 10 μm or less, and the average value thereof (d1) was 8 μm. Similarly, when ten incision depths, which were arbitrarily selected, in the release substrate in the second precut processing were measured, all of them were 10 μm or less, and the average value thereof (d2) was 9 μm. The measurement of these incision depths was performed by cross-section observation with an electron microscope.

Example 2

An adhesive sheet of Example 2 was produced in the same manner as in Example 1 except that the first and second precut processing were performed so that the incision depths in the release substrate is 20 μm or less.

When ten incision depths, which were arbitrarily selected, in the release substrate in the first precut processing were measured, all of them were 20 μm or less, and the average value thereof (d1) was 15 μm. Similarly, when ten incision depths, which were arbitrarily selected, in the release substrate in the second precut processing were measured, all of them were 20 μm or less, and the average value thereof (d2) was 16 μm.

Comparative Example 1

An adhesive sheet of Comparative Example 1 was produced in the same manner as in Example 1 except that the first and second precut processing were performed so that the incision depths in the release substrate is 35 μm or less.

When ten incision depths, which were arbitrarily selected, in the release substrate in the first precut processing were measured, all of them were within a range of 25 to 35 μm, and the average value thereof (d1) was 31 μm. Similarly, when ten incision depths, which were arbitrarily selected, in the release substrate in the second precut processing were measured, all of them were within a range of 25 to 35 μm, and the average value thereof (d2) was 30 μm.

(Evaluation of Peel Defect)

The laminates comprising the adhesive layer and the tacky film was peeled off from the release substrates in the adhesive sheets obtained in Examples 1 and 2, and Comparative Example 1, and the peel defect was evaluated as follows: First, 100 adhesive sheets (an adhesive sheet in which 100 laminates comprising the tacky film and the adhesive layer on one release substrate) were prepared for each of Examples 1 and 2, and Comparative Example 1. Then, a laminating test to a wafer was performed using a wafer mounting apparatus (RAD-2500) manufactured by Lintec Corporation. In this test, the wafer size was φ8 inches (203 mm), the thickness was 150 μm, and the laminating rate was 35 mm/second. When the laminate was not peeled off from the release substrate and was not stuck to the wafer, such a film was evaluated as peel defect, and the number of the peel defect to the number of tests, 100. The results are shown in Table 1.

TABLE 1

|  | The number of the peel defect |
|---|---|
| Example 1 | 0 |
| Example 2 | 0 |
| Comparative Example 1 | 27 |

As apparent from the results of Table 1, it was confirmed that the adhesive sheets of Examples 1 and 2 could more sufficiently be inhibited from the peel defect than the adhesive sheet of Comparative Example 1.

What is claimed is:

1. A method for producing a semiconductor device, comprising:

peeling off a laminate, including an adhesive layer, a tacky layer and a substrate film in an adhesive sheet from a release substrate of the adhesive sheet, the adhesive sheet comprising the release substrate, the adhesive layer, the tacky layer, and the substrate film, laminated in order, and sticking the laminate through the adhesive layer to a semiconductor wafer to give a semiconductor wafer having the laminate;

dicing the semiconductor wafer having the laminate to give a semiconductor element having a laminate with a pre-determined size;

irradiating the tacky layer with high energy beams to lower the tack strength of the tacky layer to the adhesive layer, and then peeling the tacky layer and the substrate film from the adhesive layer to give a semiconductor element having the adhesive layer; and bonding the semiconductor element having the adhesive layer through the adhesive layer to a support member for mounting a semiconductor element, wherein the adhesive layer has a pre-determined first plane shape and is formed on part of the release substrate;

wherein a first incision is formed in the release substrate from a side bringing contact with the adhesive layer along the periphery of the plane shape of the adhesive layer;

wherein the release substrate has a thickness of 30-50 μm; and wherein the first incision has a depth of greater than zero, and less than 25 μm.

2. The method for producing a semiconductor device according to claim 1, wherein the tacky layer and the substrate film are peeled from the adhesive layer by picking up the semiconductor element having the adhesive layer from the tacky layer.

3. The method for producing a semiconductor device according to claim 1, wherein the incision has a depth in the range of 5-15 μm.

* * * * *